(12) United States Patent
Kunnen et al.

(10) Patent No.: US 9,280,063 B2
(45) Date of Patent: Mar. 8, 2016

(54) SUBSTRATE TABLE ASSEMBLY, AN IMMERSION LITHOGRAPHIC APPARATUS AND A DEVICE MANUFACTURING METHOD

(75) Inventors: Johan Gertrudis Cornelis Kunnen, Weert (NL); Sjoerd Nicolaas Lambertus Donders, Vught (NL); Johannes Henricus Wilhelmus Jacobs, Heeze (NL); Martijn Houben, 's-Hertogenbosch (NL); Thibault Simon Mathieu Laurent, Eindhoven (NL); Frank Johannes Jacobus Van Boxtel, Eindhoven (NL); Sander Catharina Reinier Derks, Budel (NL)

(73) Assignee: ASML NETHERLANDS B.V., Veldhoven (NL)

( * ) Notice: Subject to any disclaimer, the term of this patent is extended or adjusted under 35 U.S.C. 154(b) by 365 days.

(21) Appl. No.: 13/569,926

(22) Filed: Aug. 8, 2012

(65) Prior Publication Data
US 2013/0038854 A1  Feb. 14, 2013

Related U.S. Application Data

(60) Provisional application No. 61/521,952, filed on Aug. 10, 2011, provisional application No. 61/544,875, filed on Oct. 7, 2011.

(51) Int. Cl.
| G03B 27/32 | (2006.01) |
| G03B 27/52 | (2006.01) |
| G03B 27/58 | (2006.01) |
| G03B 27/60 | (2006.01) |
| G03F 7/20 | (2006.01) |
| H01L 21/683 | (2006.01) |

(52) U.S. Cl.
CPC ............ G03F 7/70341 (2013.01); G03F 7/707 (2013.01); G03F 7/70875 (2013.01); H01L 21/683 (2013.01)

(58) Field of Classification Search
CPC . G03F 7/70341; G03F 7/70875; G03F 7/707; G03F 7/70908; G03F 7/70933; H01L 21/683; H01L 21/6838
USPC ............. 310/12.06, 12.29; 355/30, 72, 73, 77
See application file for complete search history.

(56) References Cited

U.S. PATENT DOCUMENTS

| 4,509,852 A | 4/1985 | Tabarelli et al. |
| 5,177,878 A | 1/1993 | Visser |
| 5,748,435 A | 5/1998 | Parkhe |
| 7,420,194 B2 | 9/2008 | Ottens et al. |

(Continued)

FOREIGN PATENT DOCUMENTS

| CN | 101881930 | 11/2010 |
| CN | 102067039 | 5/2011 |

(Continued)

*Primary Examiner* — Colin Kreutzer
(74) *Attorney, Agent, or Firm* — Pillsbury Winthrop Shaw Pittman LLP

(57) ABSTRACT

A substrate table assembly, an immersion lithographic apparatus and a device manufacturing method are disclosed. The substrate table assembly includes a substrate table to support a substrate; and a gas handling system to provide a gas to a region between the substrate table and a substrate mounted on the substrate table, wherein the gas provided by the gas handling system has a thermal conductivity greater than or equal to 100 mW/(m·K) at 298 K.

20 Claims, 10 Drawing Sheets

(56) References Cited

U.S. PATENT DOCUMENTS

| | | |
|---|---|---|
| 7,486,381 B2 | 2/2009 | Streeferk et al. |
| 2004/0065881 A1 | 4/2004 | Ito |
| 2004/0160582 A1 | 8/2004 | Lof et al. |
| 2004/0207824 A1 | 10/2004 | Lof et al. |
| 2005/0122503 A1* | 6/2005 | Ottens et al. .......... 355/72 |
| 2005/0254028 A1 | 11/2005 | Box |
| 2005/0259233 A1 | 11/2005 | Streefkerk et al. |
| 2006/0038968 A1 | 2/2006 | Kemper et al. |
| 2006/0102849 A1 | 5/2006 | Mertens et al. |
| 2006/0158627 A1 | 7/2006 | Kemper et al. |
| 2007/0146665 A1 | 6/2007 | Ottens et al. |
| 2007/0153244 A1* | 7/2007 | Zaal et al. ............ 355/30 |
| 2008/0202555 A1* | 8/2008 | Shibazaki ............ 134/6 |
| 2008/0212046 A1 | 9/2008 | Riepen et al. |
| 2009/0279060 A1 | 11/2009 | Direcks et al. |
| 2009/0279062 A1 | 11/2009 | Direcks et al. |
| 2009/0284894 A1* | 11/2009 | Cooke .......... 361/234 |
| 2011/0109892 A1 | 5/2011 | Van Herpen et al. |
| 2011/0128517 A1 | 6/2011 | Ottens et al. |

FOREIGN PATENT DOCUMENTS

| | | |
|---|---|---|
| CN | 102084299 | 6/2011 |
| EP | 1 420 298 | 5/2004 |
| EP | 2 261 743 | 12/2010 |
| JP | 2005-310933 | 11/2005 |
| JP | 2006-128677 | 5/2006 |
| JP | 2006-173527 | 6/2006 |
| JP | 2006-202825 | 8/2006 |
| JP | 2007-142168 | 6/2007 |
| WO | 99/49504 | 9/1999 |
| WO | 02/19399 | 3/2002 |
| WO | 2004/081999 | 9/2004 |
| WO | 2010/015511 | 2/2010 |

* cited by examiner

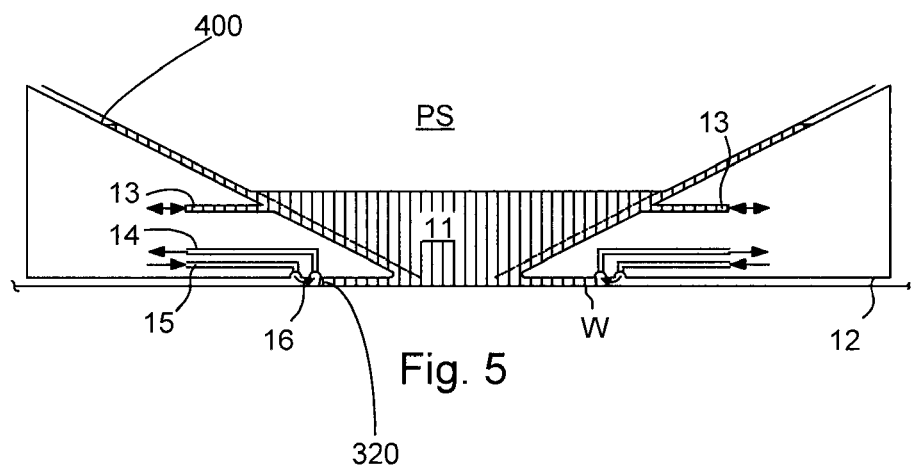
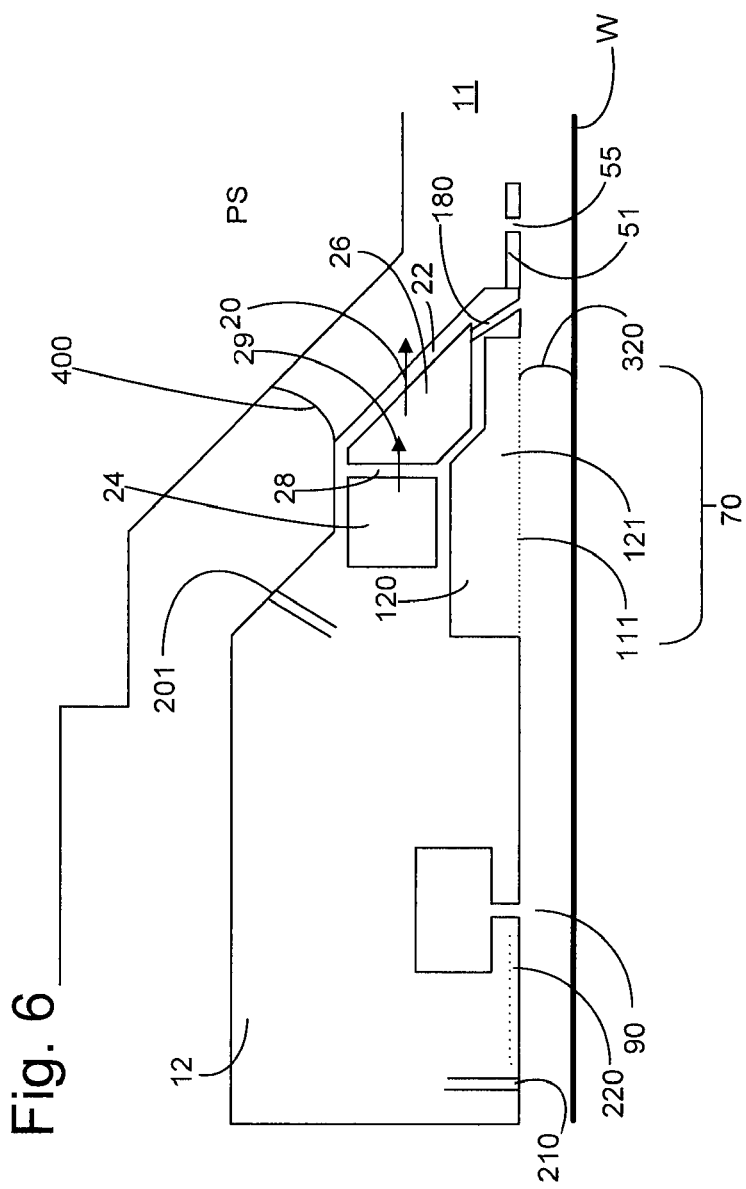

SUBSTRATE TABLE ASSEMBLY, AN IMMERSION LITHOGRAPHIC APPARATUS AND A DEVICE MANUFACTURING METHOD

This application claims priority and benefit under 35 U.S.C. §119(e) to U.S. Provisional Patent Application No. 61/521,952, filed on Aug. 10, 2011, and to U.S. Provisional Patent Application No. 61/544,875, filed on Oct. 7, 2011. The content of those applications are incorporated herein in their entirety by reference.

FIELD

The present invention relates to a substrate table assembly, an immersion lithographic apparatus and a method for manufacturing a device using an immersion lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. In an embodiment, the liquid is distilled water, although another liquid can be used. An embodiment of the invention will be described with reference to liquid. However, another fluid may be suitable, particularly a wetting fluid, an incompressible fluid and/or a fluid with higher refractive index than air, desirably a higher refractive index than water. Fluids excluding gases are particularly desirable. The point of this is to enable imaging of smaller features since the exposure radiation will have a shorter wavelength in the liquid. (The effect of the liquid may also be regarded as increasing the effective numerical aperture (NA) of the system and also increasing the depth of focus.) Other immersion liquids have been proposed, including water with solid particles (e.g. quartz) suspended therein, or a liquid with a nano-particle suspension (e.g. particles with a maximum dimension of up to 10 nm). The suspended particles may or may not have a similar or the same refractive index as the liquid in which they are suspended. Other liquids which may be suitable include a hydrocarbon, such as an aromatic, a fluorohydrocarbon, and/or an aqueous solution.

Submersing the substrate or substrate and substrate table in a bath of liquid (see, for example, U.S. Pat. No. 4,509,852) means that there is a large body of liquid that must be accelerated during a scanning exposure. This requires additional or more powerful motors and turbulence in the liquid may lead to undesirable and unpredictable effects.

In an immersion apparatus, immersion fluid is handled by a fluid handling system, device structure or apparatus. In an embodiment the fluid handling system may supply immersion fluid and therefore be a fluid supply system. In an embodiment the fluid handling system may at least partly confine immersion fluid and thereby be a fluid confinement system. In an embodiment the fluid handling system may provide a barrier to immersion fluid and thereby be a barrier member, such as a fluid confinement structure. In an embodiment the fluid handling system may create or use a flow of gas, for example to help in controlling the flow and/or the position of the immersion fluid. The flow of gas may form a seal to confine the immersion fluid so the fluid handling structure may be referred to as a seal member; such a seal member may be a fluid confinement structure. In an embodiment, immersion liquid is used as the immersion fluid. In that case the fluid handling system may be a liquid handling system. In reference to the aforementioned description, reference in this paragraph to a feature defined with respect to fluid may be understood to include a feature defined with respect to liquid.

SUMMARY

Evaporation of immersion fluid in contact with the substrate can cause cooling of the substrate. This cooling can cause deformation of the substrate. Deformation of the substrate can cause errors in the pattern formed on the substrate. The temperature of the substrate table can be controlled to provide heat to the substrate and compensate cooling caused by evaporation of the immersion liquid. However, it can be difficult to provide sufficiently rapid and accurate compensation using this approach.

It is desirable, for example, to provide improved compensation of cooling of a substrate due to evaporation of immersion liquid.

According to an aspect, there is provided a substrate table assembly for an immersion lithography apparatus, the substrate table assembly comprising: a substrate table to support a substrate; and a gas handling system to provide a gas to a region between the substrate table and a substrate mounted on the substrate table, wherein the gas provided by the gas handling system has a thermal conductivity greater than or equal to 100 mW/(m·K) at 298 K, wherein the gas provided by the gas handling system comprises $H_2$.

According to an aspect, there is provided a substrate table assembly for an immersion lithography apparatus, the substrate table assembly comprising: a substrate table to support a substrate; and a gas handling system to provide a gas to a region between the substrate table and a substrate mounted on the substrate table, wherein the gas provided by the gas handling system has a thermal conductivity greater than or equal to 100 mW/(m·K) at 298 K and wherein the substrate table comprises a supply port to supply the gas from the gas handling system to the region between the substrate and the substrate table, and an extraction port to extract fluid from the region, the extraction port comprising a peripheral extraction port configured to provide a laterally inward flow of ambient gas, immersion fluid, or both, from a region adjacent to the periphery of the substrate.

According to an aspect, there is provided a substrate table assembly for an immersion lithography apparatus, the substrate table assembly comprising: a substrate table to support a substrate; and a gas handling system to provide a first gas to a region between the substrate table and a substrate mounted on the substrate table, wherein the first gas provided by the gas handling system has a thermal conductivity greater than or equal to 100 mW/(m·K) at 298 K, wherein the gas handling system is further configured to provide a buffer gas as a second gas to the region between the substrate table and a substrate mounted on the substrate table, the buffer gas having a different composition to the first gas.

According to an aspect, there is provided a substrate table assembly for an immersion lithography apparatus, the substrate table assembly comprising: a substrate table to support a substrate; and a gas handling system to provide a gas to a region between the substrate table and a substrate mounted on the substrate table, wherein the gas provided by the gas handling system has a thermal conductivity greater than or equal to 100 mW/(m·K) at 298 K, and wherein the substrate table comprises a through-hole having an opening into the region between the substrate and the substrate table.

According to an aspect, there is provided a substrate table assembly for an immersion lithography apparatus, the substrate table assembly comprising: a substrate table to support a substrate; a gas handling system to provide a gas to a region between the substrate table and a substrate mounted on the substrate table, wherein the gas provided by the gas handling system has a thermal conductivity greater than or equal to 100 mW/(m·K) at 298 K; and an edge seal to provide a seal at an outer peripheral edge of the substrate between the region above the substrate and the region in between the substrate and the substrate table, wherein the assembly is configured to provide a laterally inward flow of the gas having a thermal conductivity greater than or equal to 100 mW/(m·K) at 298 K from a region adjacent to the periphery of the substrate.

According to an aspect, there is provided a substrate table assembly for an immersion lithography apparatus, the substrate table assembly comprising: a substrate table to support a substrate; and a gas handling system to provide a gas to a region between the substrate table and a substrate mounted on the substrate table, wherein the gas provided by the gas handling system has a thermal conductivity greater than or equal to 100 mW/(m·K) at 298 K, and wherein the gas handling system comprises a flushing reservoir to store gas having a thermal conductivity greater than or equal to 100 mW/(m·K) at 298 K at a pressure greater than atmospheric pressure.

According to an aspect, there is provided a substrate table assembly for an immersion lithography apparatus, the substrate table assembly comprising: a substrate table to support a substrate; and a gas handling system to provide a gas to a region between the substrate table and a substrate mounted on the substrate table, wherein the gas provided by the gas handling system has a thermal conductivity greater than or equal to 100 mW/(m·K) at 298 K, and the gas handling system comprises a reprocessing system to extract gas having a thermal conductivity greater than or equal to 100 mW/(m·K) at 298 K from fluid that has passed through the region between the substrate and the substrate table.

According to an aspect, there is provided a substrate table assembly for an immersion lithography apparatus, the substrate table assembly comprising: a substrate table to support a substrate; a gas handling system to provide a gas to a region between the substrate table and a substrate mounted on the substrate table, wherein the gas provided by the gas handling system has a thermal conductivity greater than or equal to 100 mW/(m·K) at 298 K; and a suction reservoir configured to be held at a partial vacuum and selectively connectable to the region between the substrate and the substrate table to remove fluid therefrom.

According to an aspect, there is provided a substrate table assembly for an immersion lithography apparatus, the substrate table assembly comprising: a substrate table to support a substrate; and a liquid handling system to provide a liquid to a region between the substrate table and the substrate mounted on the substrate table so as to cover in use at least 20% of the surface area of the portion of the substrate table that is directly opposite the substrate.

According to an aspect, there is provided a substrate table assembly for an immersion lithography apparatus, the substrate table assembly comprising: a substrate table to support a substrate; and a gas handling system to provide a gas to a region between the substrate table and a substrate mounted on the substrate table, wherein the substrate table comprises a through-hole having an opening into the region between the substrate and the substrate table, and the assembly further comprises a through-hole flow restricting structure surrounding the opening of the through-hole, the through-hole flow restricting structure forming a closed path around the opening.

According to an aspect, there is provided a device manufacturing method, comprising: projecting a patterned beam of radiation through an immersion liquid confined to a space between a projection system and a substrate; and providing gas to a region between the substrate and a substrate table, wherein the gas has a thermal conductivity greater than or equal to 100 mW/(m·K) at 298 K, wherein the gas comprises $H_2$.

According to an aspect, there is provided a device manufacturing method, comprising: projecting a patterned beam of radiation through an immersion liquid confined to a space between a projection system and a substrate; providing gas to a region between the substrate and a substrate table, wherein the gas has a thermal conductivity greater than or equal to 100 mW/(m·K) at 298 K; and providing a laterally inward flow of ambient gas, immersion fluid, or both, from a region adjacent to the periphery of the substrate.

According to an aspect, there is provided a device manufacturing method, comprising: projecting a patterned beam of radiation through an immersion liquid confined to a space between a projection system and a substrate; providing a first gas to a region between the substrate and a substrate table, wherein the first gas has a thermal conductivity greater than or equal to 100 mW/(m·K) at 298 K; and providing a buffer gas as a second gas to the region between the substrate and the substrate table, the buffer gas having a different composition to the first gas.

According to an aspect, there is provided a device manufacturing method, comprising: projecting a patterned beam of radiation through an immersion liquid confined to a space between a projection system and a substrate; and providing gas to a region between the substrate and a substrate table, wherein the gas has a thermal conductivity greater than or equal to 100 mW/(m·K) at 298 K, and wherein the substrate table comprises a through-hole having an opening into the region between the substrate and the substrate table.

According to an aspect, there is provided a device manufacturing method, comprising: projecting a patterned beam of radiation through an immersion liquid confined to a space between a projection system and a substrate; providing gas to a region between the substrate and a substrate table, wherein the gas has a thermal conductivity greater than or equal to 100 mW/(m·K) at 298 K; sealing at an outer peripheral edge of the substrate between the region above the substrate and the region in between the substrate and the substrate table; and providing a laterally inward flow of the gas having a thermal conductivity greater than or equal to 100 mW/(m·K) at 298 K from a region adjacent to the periphery of the substrate.

According to an aspect, there is provided a device manufacturing method, comprising: projecting a patterned beam of radiation through an immersion liquid confined to a space between a projection system and a substrate; providing gas to a region between the substrate and a substrate table, wherein the gas has a thermal conductivity greater than or equal to 100 mW/(m·K) at 298 K; and extracting gas having a thermal conductivity greater than or equal to 100 mW/(m·K) at 298 K from fluid that has passed through the region between the substrate and the substrate table in order to reuse the extracted gas.

According to an aspect, there is provided a device manufacturing method, comprising: projecting a patterned beam of radiation through an immersion liquid confined to a space between a projection system and a substrate; and providing liquid to a region between the substrate and a substrate table supporting the substrate so as to cover at least 20% of the surface area of the portion of the substrate table that is directly opposite the substrate.

According to an aspect, there is provided a device manufacturing method, comprising: projecting a patterned beam of radiation through an immersion liquid confined to a space between a projection system and a substrate; and providing gas to a region between the substrate and a substrate table, wherein the substrate table comprises a through-hole having an opening into the region between the substrate and the substrate table, and wherein a through-hole flow restricting structure surrounds the opening of the through-hole, the through-hole flow restricting structure forming a closed path around the opening.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 5 depicts a further liquid supply system for use in a lithographic projection apparatus;

FIG. 6 depicts, in cross-section, a further liquid supply system for use in a lithographic projection apparatus;

DETAILED DESCRIPTION

Figure 1:
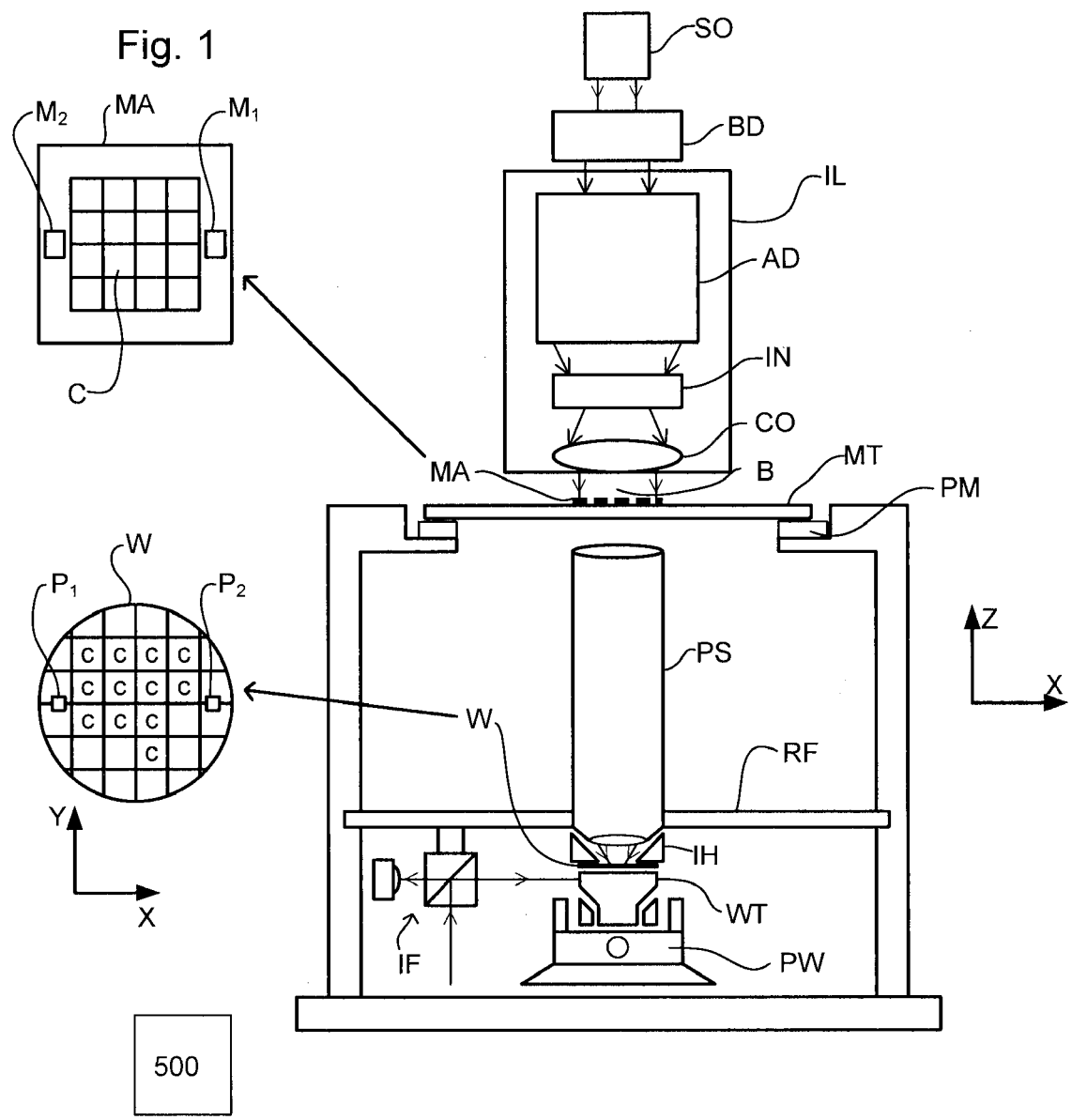
FIG. 1 depicts a lithographic apparatus according to an embodiment of the invention.

FIG. 1 schematically depicts a lithographic apparatus according to one embodiment of the invention. The apparatus comprises:

- an illumination system (illuminator) IL configured to condition a radiation beam B (e.g. UV radiation or DUV radiation);
- a support structure (e.g. a mask table) MT constructed to support a patterning device (e.g. a mask) MA and connected to a first positioner PM configured to accurately position the patterning device MA in accordance with certain parameters;
- a support table, e.g. a sensor table to support one or more sensors or a substrate table WT constructed to hold a substrate (e.g. a resist-coated substrate) W, connected to a second positioner PW configured to accurately position the surface of the table, for example of a substrate W, in accordance with certain parameters; and
- a projection system (e.g. a refractive projection lens system) PS configured to project a pattern imparted to the radiation beam B by patterning device MA onto a target portion C (e.g. comprising one or more dies) of the substrate W.

The illumination system IL may include various types of optical components, such as refractive, reflective, catadioptric, magnetic, electromagnetic, electrostatic or other types of optical components, or any combination thereof, for directing, shaping, or controlling radiation.

The support structure MT holds the patterning device MA. It holds the patterning device MA in a manner that depends on the orientation of the patterning device MA, the design of the lithographic apparatus, and other conditions, such as for example whether or not the patterning device MA is held in a vacuum environment. The support structure MT can use mechanical, vacuum, electrostatic or other clamping techniques to hold the patterning device MA. The support structure MT may be a frame or a table, for example, which may be fixed or movable as required. The support structure MT may ensure that the patterning device MA is at a desired position, for example with respect to the projection system PS. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device MA may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small minors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two or more tables (or stages or supports), e.g., two or more substrate tables or a combination of one or more substrate tables and one or more cleaning, sensor or measurement tables. For example, in an embodiment, the lithographic apparatus is a multi-stage apparatus comprising two or more tables located at the exposure side of the projection system, each table comprising and/or holding one or more objects. In an embodiment, one or more of the tables may hold a radiation-sensitive substrate. In an embodiment, one or more of the tables may hold a sensor to measure radiation from the projection system. In an embodiment, the multi-stage apparatus comprises a first table configured to hold a radiation-sensitive substrate (i.e., a substrate table) and a second table not configured to hold a radiation-sensitive substrate (referred to hereinafter generally, and without limitation, as a measurement, sensor and/or cleaning table). The second table may comprise and/or may hold one or more objects, other than a radiation-sensitive substrate. Such one or more objects may include one or more selected from the following: a sensor to measure radiation from the projection system, one or more alignment marks, and/or a cleaning device (to clean, e.g., the liquid confinement structure).

In such "multiple stage" (or "multi-stage") machines the multiple tables may be used in parallel, or preparatory steps may be carried out on one or more tables while one or more other tables are being used for exposure. The lithographic apparatus may have two or more patterning device tables (or stages or supports) which may be used in parallel in a similar manner to substrate, cleaning, sensor and/or measurement tables.

In an embodiment, the lithographic apparatus may comprise an encoder system to measure the position, velocity, etc. of a component of the apparatus. In an embodiment, the component comprises a substrate table. In an embodiment, the component comprises a measurement and/or sensor and/or cleaning table. The encoder system may be in addition to or an alternative to the interferometer system referred to herein for the tables. The encoder system comprises a sensor, transducer or readhead associated, e.g., paired, with a scale or grid. In an embodiment, the movable component (e.g., the substrate table and/or the measurement and/or sensor and/or cleaning table) has one or more scales or grids and a frame of the lithographic apparatus with respect to which the component moves has one or more of sensors, transducers or readheads. The one or more sensors, transducers or readheads cooperate with the scale(s) or grid(s) to determine the position, velocity, etc. of the component. In an embodiment, a frame of the lithographic apparatus with respect to which a component moves has one or more scales or grids and the movable component (e.g., the substrate table and/or the measurement and/or sensor and/or cleaning table) has one or more of sensors, transducers or readheads that cooperate with the scale(s) or grid(s) to determine the position, velocity, etc. of the component.

Referring to FIG. 1, the illuminator IL receives a radiation beam from a radiation source SO. The source SO and the lithographic apparatus may be separate entities, for example when the source SO is an excimer laser. In such cases, the source SO is not considered to form part of the lithographic apparatus and the radiation beam is passed from the source SO to the illuminator IL with the aid of a beam delivery system BD comprising, for example, suitable directing mirrors and/or a beam expander. In other cases the source SO may be an integral part of the lithographic apparatus, for example when the source SO is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator IL can be adjusted. In addition, the illuminator IL may comprise various other components, such as an integrator IN and a condenser CO. The illuminator IL may be used to condition the radiation beam, to have a desired uniformity and intensity distribution in its cross-section. Similar to the source SO, the illuminator IL may or may not be considered to form part of the lithographic apparatus. For example, the illuminator IL may be an integral part of the lithographic apparatus or may be a separate entity from the lithographic apparatus. In the latter case, the lithographic apparatus may be configured to allow the illuminator IL to be mounted thereon. Optionally, the illuminator IL is detachable and may be separately provided (for example, by the lithographic apparatus manufacturer or another supplier).

The radiation beam B is incident on the patterning device (e.g., mask) MA, which is held on the support structure (e.g., mask table) MT, and is patterned by the patterning device MA. Having traversed the patterning device MA, the radiation beam B passes through the projection system PS, which focuses the beam onto a target portion C of the substrate W.

With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B. e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed (at least during exposure). Patterning device MA and substrate W may be aligned using patterning device alignment marks M1, M2 and substrate alignment marks P1, P2. Although the substrate alignment marks as illustrated occupy dedicated target portions, they may be located in spaces between target portions C (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam B is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam B is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion C in a single dynamic exposure, whereas the length of the scanning motion determines the height (in the scanning direction) of the target portion C. The size of the slit in the scanning direction may also partially determine the height (in the scanning direction) of the target portion C.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Although specific reference may be made in this text to the use of lithographic apparatus in the manufacture of ICs, it should be understood that the lithographic apparatus described herein may have other applications in manufacturing components with microscale, or even nanoscale, features, such as the manufacture of integrated optical systems, guidance and detection patterns for magnetic domain memories, flat-panel displays, liquid-crystal displays (LCDs), thin-film magnetic heads, etc.

Arrangements for providing liquid between a final element of the projection system PS and the substrate can be classed into three general categories. These are the bath type arrangement, the so-called localized immersion system and the all-wet immersion system. In a bath type arrangement substantially the whole of the substrate W and optionally part of the substrate table WT is submersed in a bath of liquid.

A localized immersion system uses a liquid supply system in which liquid is only provided to a localized area of the substrate. The space filled by liquid is smaller in plan than the top surface of the substrate and the area filled with liquid remains substantially stationary relative to the projection system PS while the substrate W moves underneath that area. FIGS. 2-6 show different supply devices which can be used in such a system. A sealing feature is present to seal liquid to the localized area. One way which has been proposed to arrange for this is disclosed in PCT patent application publication no. WO 99/49504.

In an all wet arrangement the liquid is unconfined. The whole top surface of the substrate and all or part of the substrate table is covered in immersion liquid. The depth of the liquid covering at least the substrate is small. The liquid may be a film, such as a thin film, of liquid on the substrate. Immersion liquid may be supplied to or in the region of a projection system and a facing surface facing the projection system (such a facing surface may be the surface of a substrate and/or a substrate table). Any of the liquid supply devices of FIGS. 2-6 can also be used in such a system. However, a sealing feature is not present, not activated, not as efficient as normal or otherwise ineffective to seal liquid to only the localized area.

Figure 2:
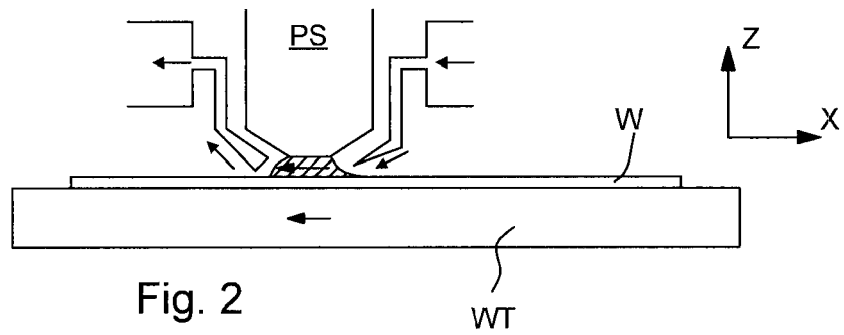
FIGS. 2 and 3 depict a liquid supply system for use in a lithographic projection apparatus.
Figure 3:
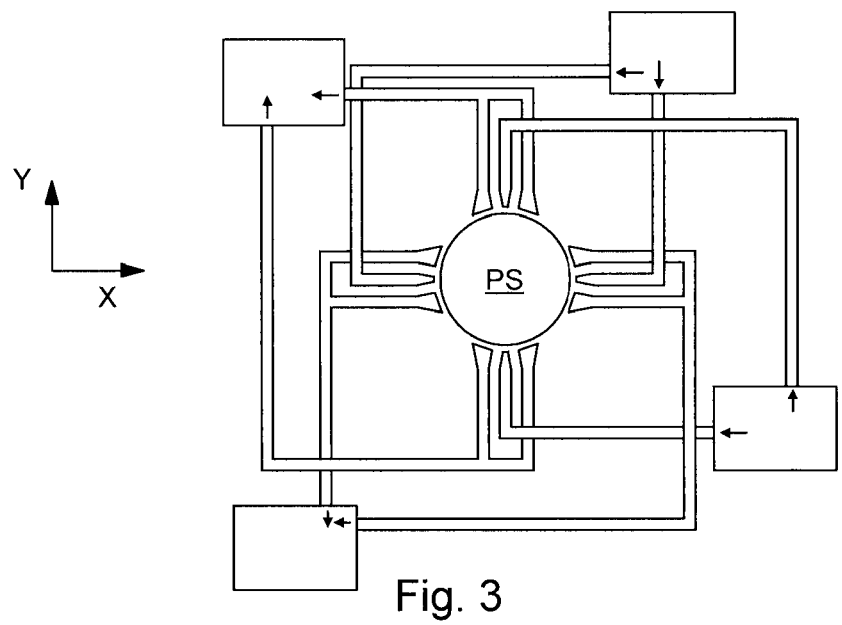

As illustrated in FIGS. 2 and 3, liquid is supplied by at least one inlet onto the substrate, preferably along the direction of movement of the substrate relative to the final element. Liquid is removed by at least one outlet after having passed under the projection system. As the substrate is scanned beneath the element in a −X direction, liquid is supplied at the +X side of the element and taken up at the −X side. FIG. 2 shows the arrangement schematically in which liquid is supplied via inlet and is taken up on the other side of the element by outlet which is connected to a low pressure source. In the illustration of FIG. 2 the liquid is supplied along the direction of movement of the substrate relative to the final element, though this does not need to be the case. Various orientations and numbers of in- and out-lets positioned around the final element are possible; one example is illustrated in FIG. 3 in which four sets of an inlet with an outlet on either side are provided in a regular pattern around the final element. Note that the direction of flow of the liquid is shown by arrows in FIGS. 2 and 3.

Figure 4:
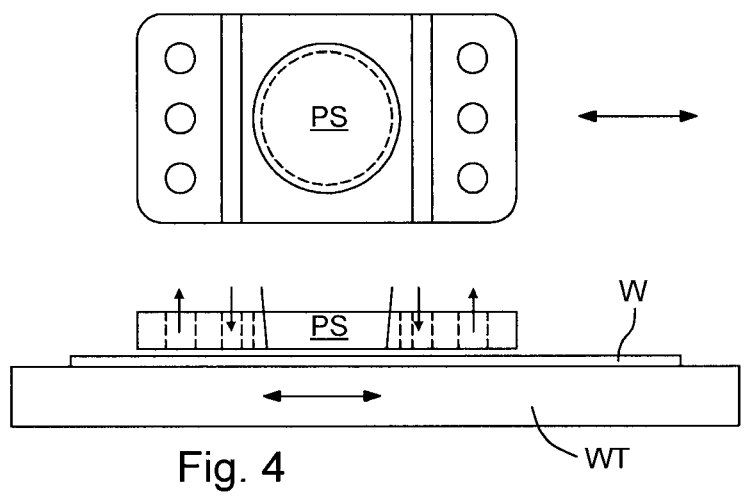
FIG. 4 depicts a further liquid supply system for use in a lithographic projection apparatus.

A further immersion lithography solution with a localized liquid supply system is shown in FIG. 4. Liquid is supplied by two groove inlets on either side of the projection system PS and is removed by a plurality of discrete outlets arranged radially outwardly of the inlets. The inlets can be arranged in a plate with a hole in its centre and through which the projection beam is projected. Liquid is supplied by one groove inlet on one side of the projection system PS and removed by a plurality of discrete outlets on the other side of the projection system PS, causing a flow of a thin film of liquid between the projection system PS and the substrate W. The choice of which combination of inlet and outlets to use can depend on the direction of movement of the substrate W (the other combination of inlet and outlets being inactive). Note that the direction of flow of fluid and of the substrate is shown by arrows in FIG. 4.

Another arrangement which has been proposed is to provide the liquid supply system with a liquid confinement structure which extends along at least a part of a boundary of the space between the final element of the projection system and the substrate table. Such an arrangement is illustrated in FIG. 5.

In an embodiment, the lithographic apparatus comprises a liquid confinement structure that has a liquid removal device having an inlet covered with a mesh or similar porous material. The mesh or similar porous material provides a two-dimensional array of holes contacting the immersion liquid in a space between the final element of the projection system and a movable table (e.g., the substrate table). In an embodiment, the mesh or similar porous material comprises a honeycomb or other polygonal mesh. In an embodiment, the mesh or similar porous material comprises a metal mesh. In an embodiment, the mesh or similar porous material extends all the way around the image field of the projection system of the lithographic apparatus. In an embodiment, the mesh or similar porous material is located on a bottom surface of the liquid confinement structure and has a surface facing towards the table. In an embodiment, the mesh or similar porous material has at least a portion of its bottom surface generally parallel with a top surface of the table.

FIG. 5 schematically depicts a localized liquid supply system or fluid handling structure 12, which extends along at least a part of a boundary of the space between the final element of the projection system and the substrate table WT or substrate W. (Please note that reference in the following text to surface of the substrate W also refers in addition or in the alternative to a surface of the substrate table, unless expressly stated otherwise.) The fluid handling structure 12 is substantially stationary relative to the projection system in the XY plane though there may be some relative movement in the Z direction (in the direction of the optical axis). In an embodiment, a seal is formed between the fluid handling structure 12 and the surface of the substrate W, which may be a contactless seal such as a gas seal (such a system with a gas seal is disclosed in European patent application publication no. EP-A-1,420,298) or liquid seal.

The fluid handling structure 12 at least partly contains liquid in the space 11 between a final element of the projection system PS and the substrate W. A contactless seal 16 to the substrate W may be formed around the image field of the projection system PS so that liquid is confined within the space between the substrate W surface and the final element of the projection system PS. The space 11 is at least partly formed by the fluid handling structure 12 positioned below and surrounding the final element of the projection system PS. Liquid is brought into the space below the projection system PS and within the fluid handling structure 12 by liquid inlet 13. The liquid may be removed by liquid outlet 13. The fluid handling structure 12 may extend a little above the final element of the projection system. The liquid level rises above the final element so that a buffer of liquid is provided. In an embodiment, the fluid handling structure 12 has an inner periphery that at the upper end closely conforms to the shape of the projection system or the final element thereof and may, e.g., be round. At the bottom, the inner periphery closely conforms to the shape of the image field, e.g., rectangular, though this need not be the case.

The liquid may be contained in the space 11 by a gas seal 16 which, during use, is formed between the bottom of the fluid handling structure 12 and the surface of the substrate W. The gas seal is formed by gas. The gas in the gas seal is provided under pressure via inlet 15 to the gap between the fluid handling structure 12 and substrate W. The gas is extracted via outlet 14. The overpressure on the gas inlet 15, vacuum level on the outlet 14 and geometry of the gap are arranged so that there is a high-velocity gas flow 16 inwardly that confines the liquid. The force of the gas on the liquid between the fluid handling structure 12 and the substrate W contains the liquid in a space 11. The inlets/outlets may be annular grooves which surround the space 11. The annular grooves may be continuous or discontinuous. The flow of gas 16 is effective to contain the liquid in the space 11. Such a system is disclosed in United States patent application publication no. US 2004-0207824, which is hereby incorporated by reference in its entirety. In an embodiment, the fluid handling structure 12 does not have a gas seal.

FIG. 6 illustrates a fluid handling structure 12 which is part of a liquid supply system. The fluid handling structure 12 extends around the periphery (e.g. circumference) of the final element of the projection system PS.

A plurality of openings 20 in the surface which in part defines the space 11 provides the liquid to the space 11. The liquid passes through openings 29, 20 in side walls 28, 22 respectively through respective chambers 24, 26 prior to entering the space 11.

A seal is provided between the bottom of the fluid handling structure 12 and a facing surface, e.g. the substrate W, or a substrate table WT, or both. In FIG. 6 a seal device is configured to provide a contactless seal and is made up of several components. Radially outwardly from the optical axis of the projection system PS, there is provided a (optional) flow control plate 51 which extends into the space 11. The control plate 51 may have an opening 55 to permit flow liquid therethrough; the opening 55 may be beneficial if the control plate 51 is displaced in the Z direction (e.g., parallel to the optical axis of the projection system PS). Radially outwardly of the flow control plate 51 on the bottom surface of the fluid handling structure 12 facing (e.g., opposite) the facing surface, e.g., the substrate W, may be an opening 180. The opening 180 can provide liquid in a direction towards the facing surface. During imaging this may be useful in preventing bubble formation in the immersion liquid by filling a gap between the substrate W and substrate table WT with liquid.

Radially outwardly of the opening 180 may be an extractor assembly 70 to extract liquid from between the fluid handling structure 12 and the facing surface. The extractor assembly 70 may operate as a single phase or as a dual phase extractor. The extractor assembly 70 acts as a meniscus pinning feature of a meniscus 320 of the liquid.

Radially outwardly of the extractor assembly may be a gas knife 90. An arrangement of the extractor assembly and gas knife is disclosed in detail in United States patent application publication no. US 2006/0158627 incorporated herein in its entirety by reference.

The extractor assembly 70 as a single phase extractor may comprise a liquid removal device, extractor or inlet such as the one disclosed in United States patent application publication no. US 2006-0038968, incorporated herein in its entirety by reference. In an embodiment, the liquid removal device 70 comprises an inlet 120 which is covered in a porous material 111 which is used to separate liquid from gas to enable single-liquid phase liquid extraction. An underpressure in chamber 121 is chosen such that the meniscuses formed in the holes of the porous material 111 prevent ambient gas from being drawn into the chamber 121 of the liquid removal device 70. However, when the surface of the porous material 111 comes into contact with liquid there is no meniscus to restrict flow and the liquid can flow freely into the chamber 121 of the liquid removal device 70.

The porous material 111 has a large number of small holes each with a dimension, e.g. a width, such as a diameter, in the range of 5 to 50 micrometers. The porous material 111 may be maintained at a height in the range of 50 to 300 micrometers above a surface, such as a facing surface, from which liquid is to be removed, e.g. the surface of a substrate W. In an embodiment, porous material 111 is at least slightly liquidphilic, i.e. having a dynamic contact angle of less than 90°, desirably less than 85° or desirably less than 80°, to the immersion liquid, e.g. water.

Radially outward of gas knife 90 may be provided one or more outlets 210 to remove gas from gas knife 90 and/or liquid that may escape past the gas knife 90. The one or more outlets 210 may be located between one or more outlets of the gas knife 90. To facilitate channeling of fluid (gas and/or liquid) to the outlet 210, a recess 220 may be provided in the liquid confinement structure 12 that is directed toward outlet 210 from outlets of the gas knife 90 and/or from between outlets of the gas knife 90.

Although not specifically illustrated in FIG. 6, the liquid supply system has an arrangement to deal with variations in the level of the liquid. This is so that liquid which builds up between the projection system PS and the liquid confinement structure 12 (and forms a meniscus 400) can be dealt with and does not escape. One way of dealing with this liquid is to provide a lyophobic (e.g., hydrophobic) coating. The coating may form a band around the top of the fluid handling structure 12 surrounding the opening and/or around the last optical element of the projection system PS. The coating may be radially outward of the optical axis of the projection system PS. The lyophobic (e.g., hydrophobic) coating helps keep the immersion liquid in the space 11. Additionally or alternatively, one or more outlets 201 may be provided to remove liquid reaching a certain high relative to the structure 12.

Another localized area arrangement is a fluid handling structure which makes use of a gas drag principle. The so-called gas drag principle has been described, for example, in United States patent application publication nos. US 2008-0212046, US 2009-0279060 and US 2009-0279062. In that system the extraction holes are arranged in a shape which may desirably have a corner. The corner may be aligned with a preferred direction of movement, such as the stepping or the scanning direction. This reduces the force on the meniscus between two openings in the surface of the fluid handing structure for a given speed in the preferred direction compared to if the two outlets were aligned perpendicular to the preferred direction. However, an embodiment of the invention may be applied to a fluid handling system which in plan has any shape, or has a component such as the extraction openings arranged in any shape. Such a shape in a non-limiting list may include an ellipse such as a circle, a rectilinear shape such as a rectangle, e.g. a square, or a parallelogram such as a rhombus or a cornered shape with more than four corners such as a four or more pointed star.

In a variation of the system of US 2008/0212046 A1, to which an embodiment of the present invention may relate, the geometry of the cornered shape in which the openings are arranged allows sharp corners (between about 60° and 90°, desirably between 75° and 90° and most desirably between 75° and 85°) to be present for the corners aligned both in the scan and in the stepping directions. This allows increased speed in the direction of each aligned corner. This is because the creation of liquid droplets due to an unstable meniscus, for example in exceeding a critical speed, in the scanning direction is reduced. Where corners are aligned with both the scanning and stepping directions, increased speed may be achieved in those directions. Desirably the speed of movement in the scanning and stepping directions may be substantially equal.

As explained above, evaporation of immersion liquid from the surface of the substrate W can cause cooling and deformation of the substrate W. The deformation can be reduced by compensating for the cooling. The cooling can be compensated by, for example, heating the substrate W. For example, the substrate W may be heated by heating the substrate table WT beneath the substrate W. The substrate table WT may be heated by running heated fluid through channels formed within the substrate table WT. In order to provide for flatness of the substrate W when it is mounted on the substrate table WT, the area of contact between the substrate W and the substrate table WT is limited. In an embodiment, the area of contact is limited by mounting the substrate W on burls on the substrate table WT. In an embodiment, the area of contact is within the range of 1-3%. Limiting the area of contact with the substrate W reduces the extent to which contaminants may find their way in between the substrate table WT and the substrate W at points of contact between the substrate table WT and the substrate W. However, limiting the area of contact with the substrate W reduces the quality of the thermal coupling between the substrate table WT and the substrate W. This reduction in the quality of thermal coupling reduces the efficiency with which heat can be transferred between the substrate table WT and the substrate W. The efficiency with which, for example, heating of the substrate table WT can be used to compensate for cooling of the substrate W is thus reduced.

Even when the temperature of the substrate table WT is not deliberately (e.g. actively) controlled to compensate a temperature variation in the substrate W, the presence of the substrate table WT will tend to reduce temperature variation. This is because the heat capacity of the substrate table WT is generally much larger than the heat capacity of the substrate W. If there is some thermal coupling between the substrate W and the substrate WT, a heat load applied to the substrate W will be shared between the substrate W and the substrate WT to a degree. Thus, thermal coupling between the substrate W and the substrate table WT will tend to reduce the size of temperature variation in the substrate W. This effect may be referred to as "passive compensation". Improving the thermal coupling between the substrate W and the substrate table WT will help improve the efficiency of this passive compensation.

In an embodiment, a high thermal conductivity gas is provided to the region in between the substrate W and the substrate table WT. In an embodiment, the volume of the region in between the substrate W and the substrate table WT is defined approximately by the height, shape and spacing of burls on which the substrate W is supported. In an embodiment, the gas has a thermal conductivity greater than or equal to 100 mW/(m·K) at 298 K (room temperature). 100 mW/(m·K) means 100 milliWatt per meter Kelvin, i.e. 0.1 Watt per meter Kelvin. Such gas may be referred to below as "high thermal conductivity gas". In an embodiment, the high thermal conductivity gas comprises He (helium), which has a thermal conductivity of 157 mW/(m·K) at room temperature, $H_2$ (hydrogen), which has a thermal conductivity of 187 mW/(m·K) at room temperature, or a mixture of He and $H_2$ (and, optionally, one or more other gases). The high thermal conductivity gas improves the thermal coupling between the substrate table WT and the substrate W. The improved thermal coupling may reduce a temperature gradient in the substrate W due to the passive compensation effect discussed above. In an embodiment the temperature of the substrate table is actively controlled to compensate measured and/or predicted cooling of the substrate W. In such an embodiment the improved thermal coupling will improve the efficiency with which the active compensation may be carried out. For example, the compensation may be carried out more accurately and/or with a shorter response time. In an embodiment, one or more of the following gases may be provided to the region in between the substrate and the substrate table WT: air, argon, and/or nitrogen. In an embodiment, one or more of air, argon and/or nitrogen are provided together with one or more of the high thermal conductivity gases mentioned above. In an embodiment, water vapor is provided in addition to any of the gases or mixtures of gases mentioned above.

Figure 7:
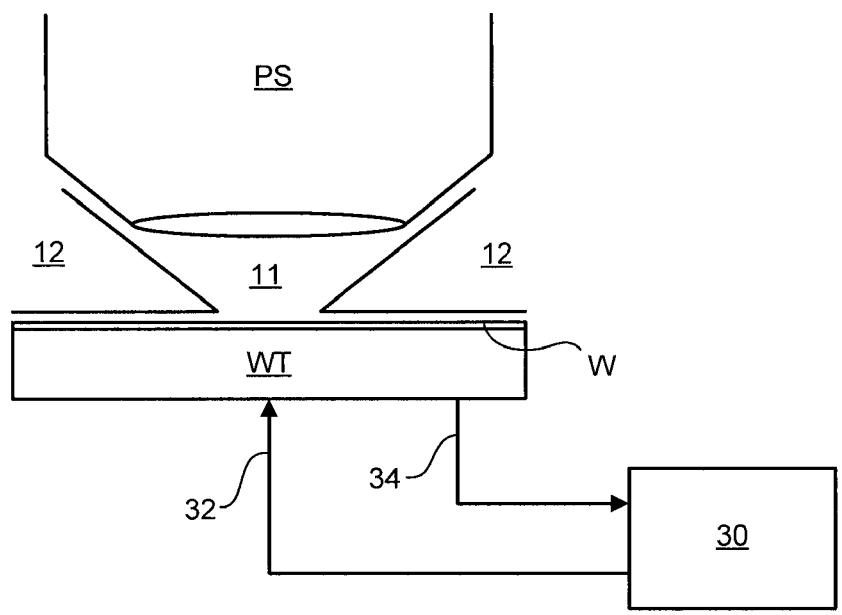
FIG. 7 depicts, in cross-section, a projection system and a substrate table assembly to supply a high thermal conductivity gas to a region between a substrate and a substrate table.

FIG. 7 depicts an embodiment comprising a gas handling system 30 to provide a gas to a region between a substrate table WT and a substrate W mounted on the substrate table WT. The gas provided by the gas handling system 30 has a thermal conductivity greater than or equal to 100 mW/(m·K) at 298 K, desirably greater than 150 mW/(m·K) at 298 K. In an embodiment, the gas is supplied to the substrate table WT by a supply line 32 and withdrawn via an extraction line 34. In an embodiment, the supply line 32 supplies gas to a portion of the region between the substrate W and substrate table WT that is laterally (e.g. radially relative to the center of the substrate W and/or substrate table WT) inside of a region from which the extraction line 34 extracts the gas. Alternatively or additionally, the supply line 32 may provide gas to a portion of the region between the substrate W and the substrate table WT that is laterally outside of the region from which the extraction line 34 extracts the gas. In general, gas can be arranged to flow in any direction. However, in certain embodiments the flow is arranged to be mostly laterally inwards. In other embodiments, the flow is arranged to be mostly laterally outwards.

FIGS. 8 to 13 are magnified views of the substrate table region in the arrangement of FIG. 7. For reasons of clarity, the burls supporting the substrate W are not shown, but it will be appreciated that burls, or their equivalent, will be present.

Figure 8:
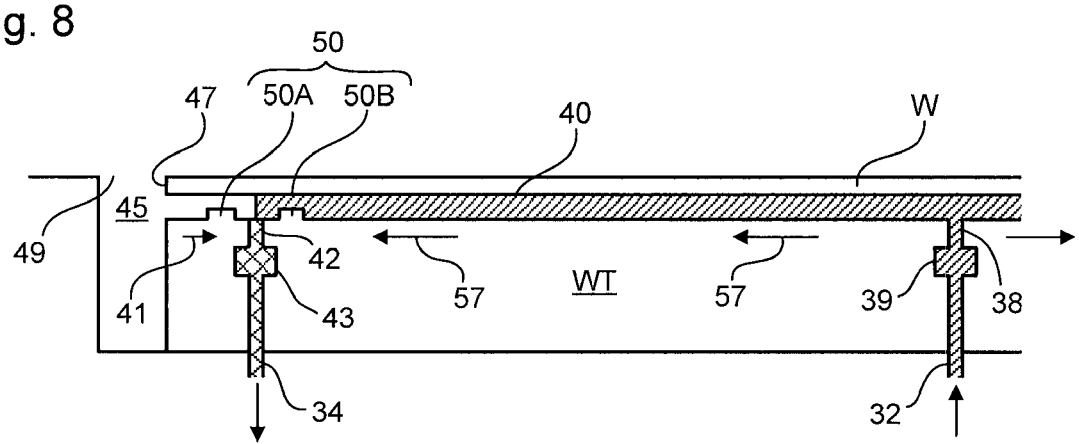
FIG. 8 depicts, in cross-section, supply and extraction ports in a substrate table.

FIG. 8 shows an embodiment in which the substrate table WT comprises one or more supply ports 38 to supply the gas from the gas handling system 30 to the region 40 between the substrate W and the substrate table WT. Also provided are one or more extraction ports 42 to extract fluid from the region 40. The one or more supply ports 38 may be connected to an intermediate supply cavity 39 located between the one or more supply ports 38 and the supply line 32. In an embodiment, the intermediate supply cavity 39 has a plurality of outputs each corresponding to one or more of a plurality of the supply ports 38. The intermediate supply cavity 39 may have only a single outlet to the supply line 32. However, in an embodiment, the intermediate supply cavity 39 has more than one outlet to the supply line 32. In an embodiment, a plurality of supply lines 32 are provided, each having a separate connection to a single intermediate supply cavity or to different intermediate supply cavities. The intermediate supply cavity 39 provides a convenient mechanism for using a limited number of supply lines 32 (for example one supply line 32) to supply fluid to a number of supply ports 38 larger than the number of supply lines 32 (for example more than one supply port 38). In an embodiment, one or more of the supply lines 32 is connected directly to one or more supply ports 38, without an intermediate supply cavity 39.

Similarly, an intermediate extraction cavity 43 may be provided in between one or more extraction ports 42 and one or more extraction lines 34. In an embodiment, the intermediate extraction cavity 43 has a plurality of outlets leading to a corresponding plurality of extraction ports 42 and a single outlet leading to the extraction line 34. In an embodiment, the intermediate extraction cavity 43 forms a closed loop having a similar size and shape to the substrate. For example, the intermediate extraction cavity 43 may be configured to run through a region of the substrate table WT in close proximity to the peripheral edge 47 of the substrate W. For example, the axis of the intermediate extraction cavity 43 may be circular.

In the arrangement shown in FIG. 8 the supply ports 38 and extraction ports 42 are positioned so as to provide a laterally inward flow (arrow 41) of ambient gas (e.g., air), immersion fluid or both, from a region 45 adjacent to the periphery 47 of the substrate W. Ambient gas and/or immersion fluid may enter through a small gap 49 which in some embodiments may be formed between the periphery 47 of the substrate W and the upper surface of the component surrounding the mounted substrate W (for example a mounting block or "encoder block" to mount the substrate table WT, or part of the substrate table WT itself). The supply ports 38 and extraction ports 42 are configured to provide a laterally outward flow of the high conductivity gas (the arrows 57 indicate flow direction, the hatched region indicates schematically the portion filled with the high conductivity gas) in a region directly adjacent (e.g. directly adjacent in a laterally inward direction) to the extraction ports 42 (which in this embodiment may be referred to as "peripheral extraction ports" because they are located so as to be in close proximity to the periphery 47 of the mounted substrate W).

In an embodiment, the inward flow (arrow 41) of ambient gas, immersion fluid or both, thus meets the laterally outward flow (arrows 57) of the high thermal conductivity gas in the region of the peripheral extraction ports 42. All of this mixture (cross-hatched portion) can therefore be conveniently removed using the same extraction ports 42, thus reducing the need for additional extraction ports. Furthermore, the inward flow of ambient gas, immersion fluid, or both, reduces the possibility of the high thermal conductivity gas escaping through the gap 49 adjacent to the periphery 47 of the substrate W. The risk, or extent, of contamination of the region above the substrate W by the high thermal conductivity gas may therefore be reduced. The risk, or extent, of disruption of measurement instruments (e.g. interferometric measurements systems) caused by a change in the composition of the ambient gas in the region above the substrate W may therefore be reduced.

In an embodiment, the provision of peripheral extraction ports 42 that suck ambient gas, immersion fluid, or both, away from the region 45 adjacent to the periphery 47 of the substrate W may advantageously reduce the risk of bubbles entering the immersion liquid in the region above the substrate W. Alternatively or additionally, the peripheral extraction ports 42 may advantageously limit the extent to which immersion fluid progresses towards the central portion of the region 40 beneath the substrate W. The provision of peripheral extraction ports 42 therefore provides desirable functionality even in the absence of a gas handling system 30 to provide high thermal conductivity gas to the region 40 beneath the substrate W. Adapting the way the high thermal conductivity gas is provided to the region 40 so as to work efficiently with such peripheral extraction ports enables desirable properties to be achieved with a minimum of additional hardware.

In an embodiment, the substrate table WT is provided with a peripheral flow restricting structure 50A, 50B to restrict flow of fluid between a laterally inner and a laterally outer portion of the region 40 between the substrate W and the substrate table WT. In the embodiment shown, a pair 50 of peripheral flow restricting structures are provided: an inner peripheral flow restricting structure 50B and an outer peripheral flow restricting structure 50A, located radially outside the inner structure 50B and completely surrounding the inner structure 50B. For the inner peripheral flow restricting structure 50B the laterally inner portion is the portion to the right of the structure 50B and the laterally outer portion is the portion to the left of the structure 50B. For the outer peripheral flow restricting structure 50A the laterally inner portion is the portion to the right of the structure 50A and the laterally outer portion is the portion to the left of the structure 50A. In the arrangement shown, the extraction port 42 is located between the inner and outer peripheral flow restricting structures 50A, 50B. In an embodiment, one or more of the peripheral flow restricting structures have a substantially circular shape that is located radially outside of the majority of the substrate W (optionally centered on the center of the substrate W). One or more of the flow restricting structures 50A, 50B may comprise a member which extends to within a few microns of the substrate W. The restricted gap between the member and the substrate increases the flow resistance and therefore restricts flow across the flow restricting structure 50A, 50B. The flow restricting structures 50A and 50B facilitate maintenance of a partial vacuum in the region laterally inside of the inner flow restricting structure 50B. In an embodiment, a partial vacuum is used to clamp the substrate W to the substrate table WT. Providing one or more extraction ports 42 between the inner and outer flow restricting structures 50A, 50B further reduces the risk, or extent, of high thermal conductivity gas escaping into the region above the substrate W. In addition, the flow restricting structures 50A, 50B reduce the risk, or extent, of contamination of the high thermal conductivity gas located in the region 40 by ambient gas, immersion fluid, or both, entering through the gap 49. In an embodiment, only one peripheral flow restricting structure is provided. In another embodiment, more than two peripheral flow restricting structures are provided.

In an embodiment, the one or more peripheral extraction ports 42 may maintain a vacuum in the region between the inner and outer peripheral flow restricting structures 50A and 50B that is deeper than the vacuum maintained in the region laterally inside of the inner structure 50B. In an embodiment, the outer peripheral flow restricting structure 50A helps to prevent the escape of high thermal conductivity gas through the gap 49 to the measurement system side of the substrate W.

In the arrangement shown in FIG. 8 two peripheral flow restricting structures 50A, 50B are provided and one or more peripheral extraction ports 42 are provided in between the two structures 50A, 50B. However, in an embodiment, one or more peripheral flow restricting structures may be provided, with or without peripheral extraction ports 42 in between. In an embodiment, two peripheral flow restricting structures 50 may be provided with no peripheral extraction ports 42 in between them. In an embodiment, one or more peripheral extraction ports 42 may be provided without any peripheral flow restricting structures 50. In an embodiment the peripheral extractions ports 42 may be arranged in a closed path, for example surrounding a majority of the region 40 beneath the substrate W (when viewed perpendicularly to the plane of the substrate W).

Figure 9:
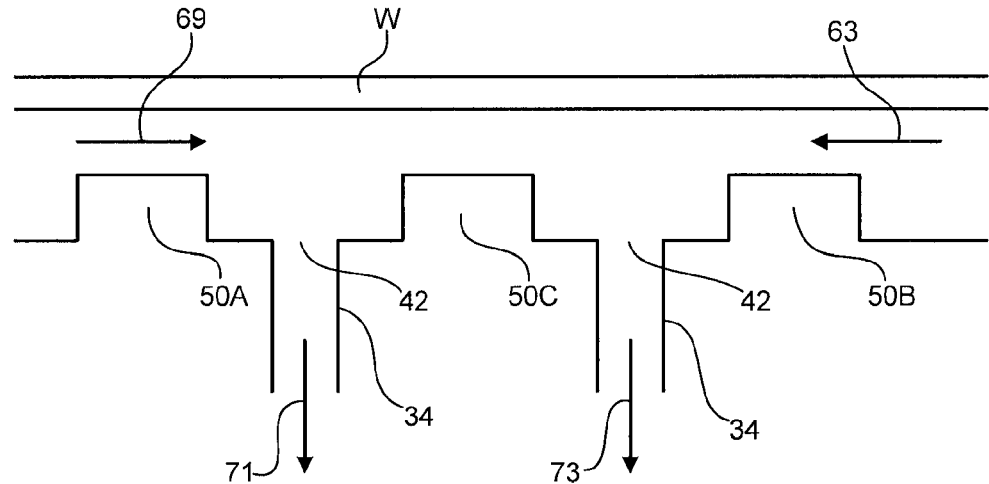
FIG. 9 depicts, in cross-section, an arrangement having three peripheral flow restricting structures.

FIG. 9 depicts a magnified view of the peripheral region of the substrate showing an embodiment in which three flow restricting structures are provided: an inner peripheral flow restricting structure 50B, an intermediate peripheral flow restricting structure 50C and an outer peripheral flow restricting structure 50A. The intermediate peripheral flow restricting structure 50C is laterally outside of (e.g. completely surrounds) structure 50B, but laterally inside of (e.g. surrounded by) structure 50A. The three structures 50A, 50B, 50C of this embodiment facilitate the maintenance of different pressures (e.g. different levels of vacuum) in four distinct regions: 1) the region inside of the structure 50B; 2) the region between the structure 50B and the structure 50C; 3) the region between the structure 50C and the structure 50A; and 4) the region outside of the structure 50A. In an embodiment, one or more peripheral extracting ports 42 may be provided in between the structures 50B and 50C. In an embodiment, one or more peripheral flow extracting ports 42 may be provided in between the structures 50C and 50A. In the arrangement shown, one or more flow restricting ports 42 is/are provided both between structures 50B and 50C, and between structures 50C and 50A. An example non-limiting flow pattern for this arrangement is shown schematically by arrows 63, 69, 71 and 73. In this arrangement, the peripheral extraction port(s) 42 between structures 50C and 50A extract(s) most of the ambient gas and/or immersion liquid entering through the gap 49. The peripheral extraction port(s) 42 between the structures 50C and 50B therefore receive less ambient gas and/or immersion liquid than would be the case in embodiments of the type shown in FIG. 8. The proportion of high thermal conductivity gas present in the gas extracted by the peripheral extraction port(s) 42 between the structures 50C and 50B is therefore much higher, which may facilitate reuse of this gas. For example, it may be possible to reuse gas extracted by the peripheral extraction port(s) 42 between the structures 50C and 50B directly (without taking any steps to purify the extracted gas first). Alternatively or additionally, the extracted gas may be reprocessed more easily due to the higher starting purity. In an embodiment, the provision of the two stages of fluid extraction (i.e. extraction between structures 50A and 50C, and between structures 50C and 50B) may further reduce the chances of ambient gas and/or immersion liquid reaching the region inside of the innermost structure 50B and/or the chances of high thermal conductivity gas escaping though the gap 49 to the measurements side of the substrate W.

Figure 10:
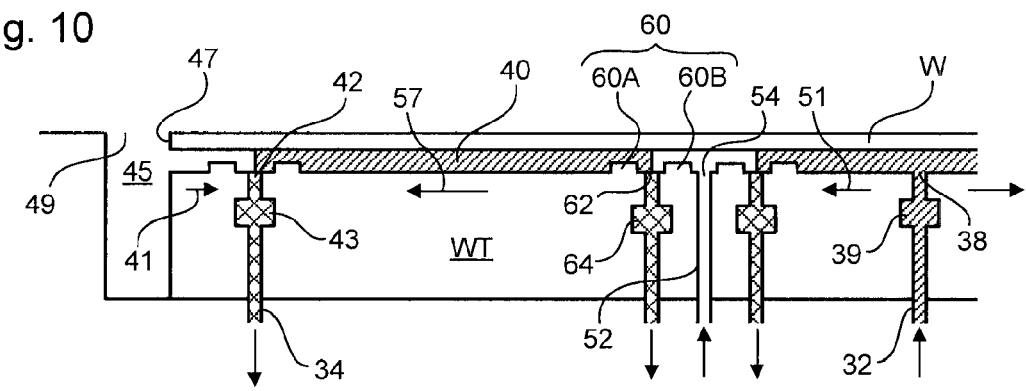
FIG. 10 depicts, in cross-section, a though-hole, a through-hole flow restricting structure and through-hole extraction ports in a substrate table.

FIG. 10 depicts schematically an example of an embodiment in which the portion of the substrate table WT located beneath the substrate W comprises one or more through-holes 52 (only one through-hole 52 is shown in FIG. 10). These through-holes 52 may be provided to facilitate mounting and/or unmounting of the substrate W from the substrate table WT for example. For example, the through-holes 52 may be configured to accommodate pins (which may be referred to as "elevation pins" for example) to push the substrate W away from the substrate table WT and/or to allow controlled lowering of the substrate W onto the substrate table WT. Alternatively or additionally, the through-holes 52 may be configured to accommodate one or more alignment pins to align the substrate table WT with a structure, such as an encoder block or mounting block, beneath the substrate table WT. For example, the alignment pin may be configured to engage with a corresponding groove or hole formed in the structure beneath the substrate table WT.

The through-hole 52 comprises an opening 54 into the region 40 between the substrate table WT and the substrate W. It may therefore be possible for the through-hole 52 to provide a route for ambient gas to enter the region 40 and contaminate the high thermal conductivity gas. Such contamination may reduce the thermal conductivity of the gas. The contamination may therefore reduce the effectiveness of the thermal coupling between the substrate table WT and the substrate W.

In the arrangement of FIG. 10, the risk, or extent, of contamination by ambient gas from the through-hole 52 is reduced by the provision of a pair 60 of through-hole flow restricting structures 60 surrounding the opening 54 to the through-hole 52: an outer through-hole flow restricting structure 60A and an inner through-hole flow restricting structure 60B. For example, the outer through-hole flow restricting structure 60A may be radially outside of the inner through-hole flow restricting structure 60B relative to the through-hole (e.g. the outer structure 60A may completely surround the inner structure 60B in a closed loop). Optionally, one or more through-hole extraction ports 62 is/are provided in between the outer and inner structures 60A, 60B. In an embodiment, the through-hole extraction port 62 comprises an intermediate through-hole extraction cavity 64. The intermediate through-hole extraction cavity 64 may optionally be formed in a closed ring (e.g. circular, polygonal, or irregular closed path) surrounding the through-hole 52. In an embodiment, a plurality of through-hole extraction ports 62 are provided that follow a closed path surrounding the opening 54 to the through-hole 52. In an embodiment, all of the through-hole extraction ports 62 surrounding a given through-hole 52 are connected to a single intermediate through-hole extraction cavity 64. In an embodiment, the number of connections between the intermediate through-hole extraction cavity 64 and the gas handling system 30 is smaller than the number of through-hole extraction ports 62 leading off the single intermediate through-hole extraction cavity 64. For example, there may be a single connection only between the gas handling system 30 and the intermediate through-hole extraction cavity 64.

Figure 11:
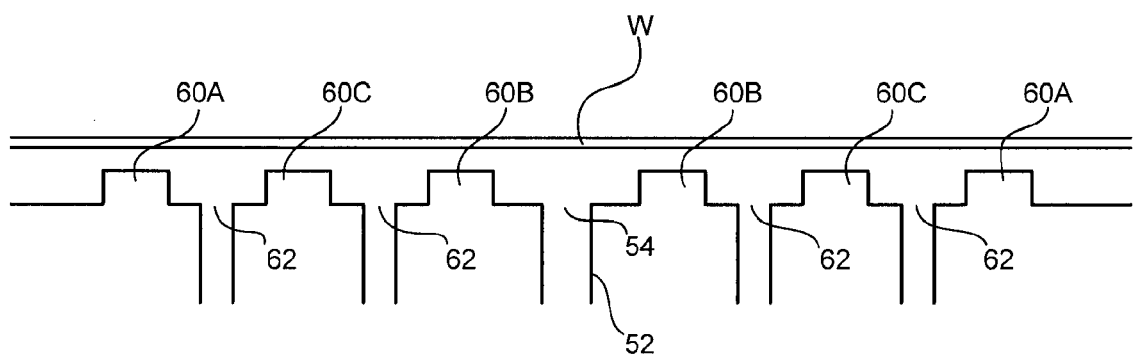
FIG. 11 depicts, in cross-section, an arrangement having three through-hole flow restricting structures.

In an embodiment, more than two flow restricting structures may be provided surrounding each of one or more through-holes by analogy with the arrangement shown in FIG. 9. An example arrangement having an intermediate flow restricting structure 60C is shown in FIG. 11, which is a magnified view of the region adjacent to a through-hole 52. One or more through hole extraction ports 62 may be provided in at least two of the regions between adjacent though-hole flow restricting structures. In the example shown, one or more through-hole extraction ports 62 are provided in the region between the structures 60B and 60C, and between the structures 60C and 60A. The purity of the gas extracted by the through-hole extraction ports 62 between the outermost structures (structure 60A in the embodiment shown) and the flow restricting structure immediately adjacent (structure 60C in the embodiment shown) in the radially inward direction (relative to the through-hole) will be increased, thus facilitating reuse of the extracted gas.

Any of the flow restricting structures mentioned above (e.g. inner, intermediate, outer, peripheral, or through-hole structures) may form closed paths. It is understood that these paths could take the form of any closed plane figure or loop. For example, the paths could be circular, polygonal, for example hexagonal, or irregularly shaped.

In the arrangement shown in FIG. 10, the through-hole 52 is surrounded both by a through-hole flow restricting structure 60A, 60B and by one or more through-hole extraction ports 62. However, in an embodiment, the through-hole 52 may be surrounded by a through-hole flow restricting structure only (without any through-hole extraction ports). In an embodiment, the through-hole 52 may be surrounded by a ring of through-hole extraction ports only (without a through-hole flow restricting structure). As can be seen schematically in FIG. 10 by reference to the boundary between the hatched portion within the region 40 and the non-hatched portion in the vicinity of the opening 54 to the through-hole 52, the ambient gas is restricted by the through-hole flow restricting structure 60A and/or by the through-hole extraction ports 62 to the region of the opening 54 to the through-hole 52. Contamination of the high conductivity gas in the region 40 may therefore be limited. Disruption to the thermal coupling between the substrate table WT and the substrate W may therefore also be limited.

Figure 12:
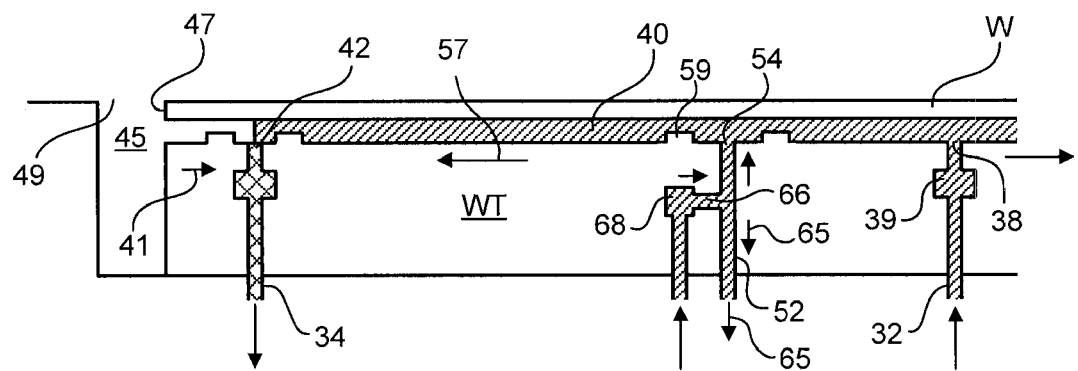
FIG. 12 depicts, in cross-section, a though-hole and a through-hole supply port in a substrate table.

FIG. 12 depicts a configuration in which the substrate table WT is provided with a through-hole supply port 66 to supply high conductivity gas to a through-hole 52 in such a way that at least in a portion of the through-hole 52 gas introduced via the through-hole supply port 66 flows away from the substrate W. In the embodiment shown, the flow away from the substrate is below the through-hole supply port 66 (arrows 65). In the arrangement shown in FIG. 12, the through-hole supply port 66 is provided so as to open out laterally into the through-hole 52. A cavity 68 may be provided for through-hole supply port 66 similar to cavity 39. Providing a flow of the high conductivity gas away from the substrate W makes it more difficult for ambient gas to travel towards the substrate W through the through-hole 52. The risk, or extent, of contamination of the region 40 by ambient gas may therefore be reduced. The arrangement of FIG. 12 could be used in combination with the arrangement of FIG. 10, for example where the arrangement of FIG. 12 is used for one or more selected through-holes and the arrangement of FIG. 10 is used for other through-holes.

In an embodiment, a flow restricting structure 59 may be provided that surrounds the opening 54 to the through-hole 52. The flow restricting structure 59 may help ensure that the pressure under the substrate W can remain at a sufficient level of partial vacuum while the pressure at the opening 54 can be higher, for example at approximately ambient pressure. The flow restricting structure 59 may promote flow of the high thermal conductivity gas away from the substrate W (arrow 65) and thus further reduce the risk of ambient gas contaminating the low thermal conductivity gas in the region 40 beneath the substrate W.

Figure 13:
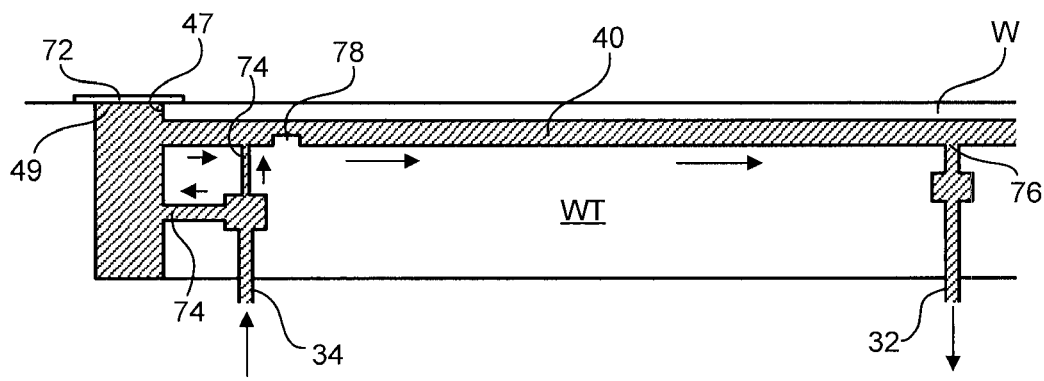
FIG. 13 depicts, in cross-section, a substrate table comprising an edge seal and a peripheral supply port.

FIG. 13 shows an arrangement in which an edge seal 72 is provided to seal the gap 49 between the periphery 47 of the substrate W and a surrounding component. The edge seal 72 may comprise a thin annular component for example. The edge seal 72 may be formed from metal or plastic for example. The edge seal 72 may be rigid or flexible. The edge seal 72 may be self-adhesive for example. The edge seal 72 may advantageously prevent contamination of the ambient gas above the gap 49. In an embodiment, the edge seal 72 may be actuated between an open state, where a substrate can pass longitudinally through it, and a closed state (in which configuration the edge seal 72 may be referred to as a "mechanical edge seal").

In an embodiment having an edge seal 72, it is not possible for ambient gas or immersion fluid to enter the region 40 beneath the substrate W through the gap 49 (or at least the extent to which this is possible is greatly reduced). In arrangements of this type, it is therefore no longer (or less) necessary to provide a mechanism to prevent or limit contamination of the region 40 by ambient gas and/or immersion fluid. In FIG. 13, one or more peripheral supply ports 74 are provided in the region adjacent to the periphery 47 of the substrate W. The peripheral supply ports 74 are configured to provide a laterally inward flow of high conductivity gas towards an inner region of the region 40. A laterally inward flow may be more convenient than a laterally outward flow where it is desired to vacuum clamp a central portion of the substrate W before clamping a peripheral portion during a substrate mounting procedure for example. An extraction port 76 is provided in a central region. A flow restricting structure 78 may be provided at a laterally inward position relative to the one or more peripheral supply ports 74. The flow restricting structure 78 may help isolate the central portion of the region 40 and thus facilitate establishment of partial vacuum in this region for clamping of the substrate W. In an embodiment, the flow restricting structure 78 comprises a flow restricting ring.

Figure 14:
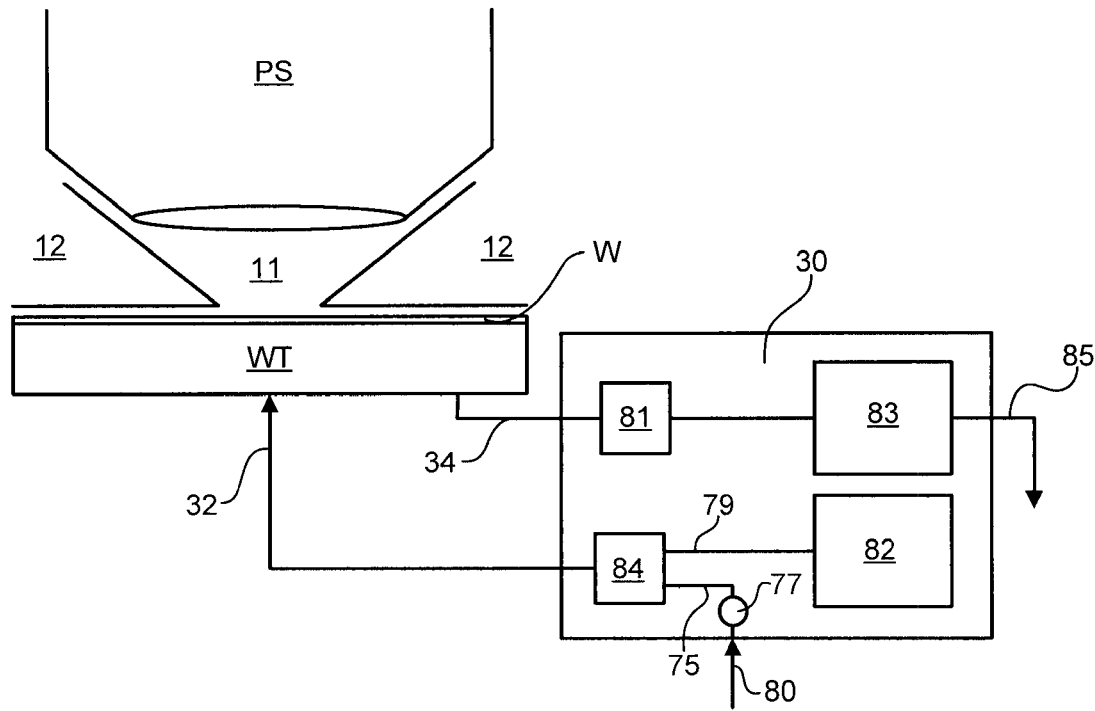
FIG. 14 depicts, in cross-section, a projection system and substrate table assembly comprising a gas handling system with a flushing reservoir, a connection system and a continuous flow system.

FIG. 14 shows an example of an embodiment comprising a flushing reservoir 82 to store high conductivity gas at a pressure greater than atmospheric pressure, for example greater than or equal to 1.5 times atmospheric pressure or higher. A connection system 84 is provided to connect the reservoir 82 to the region 40 between the substrate W and the substrate table WT. The connection system 84 can be configured to provide a relatively low flow resistance path between the reservoir 82 and the region 40 for example. By providing a low flow resistance path, the high thermal conductivity gas flows rapidly into the region 40. This rapid flow may be referred to as a "flushing flow". The flushing flow may be effective to substantially remove ("flush away") a large proportion of ambient gas from the region 40. Maintaining a relatively high pressure in the flushing reservoir 82 (e.g. greater than atmospheric pressure, for example greater than or equal to 1.5 times atmospheric pressure or higher) prior to connection to the region 40 also helps to ensure a rapid flow of gas into the region 40. In an embodiment, the flow is allowed to continue until the pressure in the region 40 becomes approximately equal to the pressure in the flushing reservoir 82. It is desirable to provide rapid filling of the region 40 so that the time to mount a substrate can be reduced. Reducing the time to mount a substrate can improve throughput. In an embodiment, the connection system 84 is configured to switch connection between the flushing reservoir 82 and a continuous flow source 80 when the flushing flow is complete (or complete to a certain extent, for example because the pressure in the flushing reservoir 82 has fallen below a certain level). For example, the connection system 84 may be configured to close off a connection 79 connecting the flushing reservoir 82 to the connection system 84 while leaving a connection 75 to the continuous flow source 80 open or, if it is not already open, opening the connection 75 to the continuous flow source 80. In such an arrangement the pressure in the continuous flow source 80 would prevent backflow. Additionally or alternatively, a check valve 77 could be positioned in between the continuous flow source 80 and the connection system 84. In an embodiment, the flushing flow could be carried out while the region 40 is open to both the flushing reservoir 82 and the continuous flow source 80 (with most of the flow coming from the flushing reservoir 82 for most of the flushing flow). The "switching" performed by the connection system 84 in this case would correspond to a switch between a state when both the continuous flow source 80 and the flushing reservoir 82 are connected to the region 40 to a state in which only the continuous flow source 80 is connected to the region 40. The connection system 84 may also be configured to provide a flow of gas from the source 80 to the flushing reservoir 82, after it has been used to provide gas to the region 40, to bring the pressure in the flushing reservoir 82 back up to a starting pressure. The volume of gas that enters the region 40 is determined by the volume of the flushing reservoir 82 and the pressure at which the gas is maintained therein prior to the flushing flow being initiated. This self-limiting behavior means that it is possible to provide a rapid flow of gas without requiring elaborate control systems for avoiding supplying too much gas.

In an embodiment, the flushing reservoir 82 may be used as follows. In a first stage, the substrate W is placed onto the substrate table WT. The pressure in a central region underneath the substrate W is then reduced by pumping ambient gas away from the central region. For example, the pressure in the central region may be reduced to about 0.5 atmospheres. In a second phase, the pressure in the peripheral region underneath the substrate W is also reduced to below atmospheric pressure, for example to approximately 0.5 atmospheres. In a third phase, the central region underneath the substrate W is connected to the flushing reservoir 82 so that high thermal conductivity gas enters the central region underneath the substrate W in a short time period. This will result in the pressure underneath the central portion of the substrate W rising quickly. The pressure in the central region may rise to approximately one atmosphere, for example, during this phase. In a fourth phase, the flow of high thermal conductivity gas is switched to a continuous flow. The continuous flow is controlled such that the pressure beneath the substrate W stabilizes at a pressure below atmospheric pressure so that the substrate W is securely attached to the substrate table WT. For example, the pressure during this phase may be stabilized at about 0.5 atmospheres.

The above described method of mounting a substrate could also be implemented without the use of a flushing reservoir. For example in the third phase the high thermal conductivity gas could be supplied using a continuous supply system, where the flow of gas is controlled, actively or passively, to achieve the desired flow rate.

In an embodiment a suction reservoir 83 may be provided to assist with removal of fluid from the region 40 between the substrate W and substrate table WT. The suction reservoir 83 may comprise a volume that is held under partial vacuum, for example at 0.1 atmospheric pressures or less. Connecting the suction reservoir 83 to the region 40 beneath the substrate W, for example by opening a valve 81, causes fluid to flow rapidly from the region 40 into the suction reservoir 83. The flow will stop when the pressures in the region 40 and suction reservoir 83 equalize or when the connection to the suction reservoir 83 is closed. In an embodiment, the amount of gas that can be extracted depends on the volume of the suction reservoir 83 and the initial partial pressure within the suction reservoir 83. It is therefore not necessary to provide sensing or control equipment to ensure that the pumping action is not excessive. The suction reservoir 83 may be used to extract ambient gas from the region beneath the substrate W, for example during a substrate mounting operation. The suction reservoir 83 may thus help to speed up the substrate mounting operation. Alternatively or additionally, the suction reservoir 83 may be used to extract high thermal conductivity gas, for example during a substrate unmounting procedure. The suction reservoir 83 may therefore help to speed up the substrate mounting procedure. A vacuum line (e.g. pump) 85 could be connected to the suction reservoir 83 to allow the partial vacuum in the suction reservoir 83 to be reestablished after use.

Figure 15:
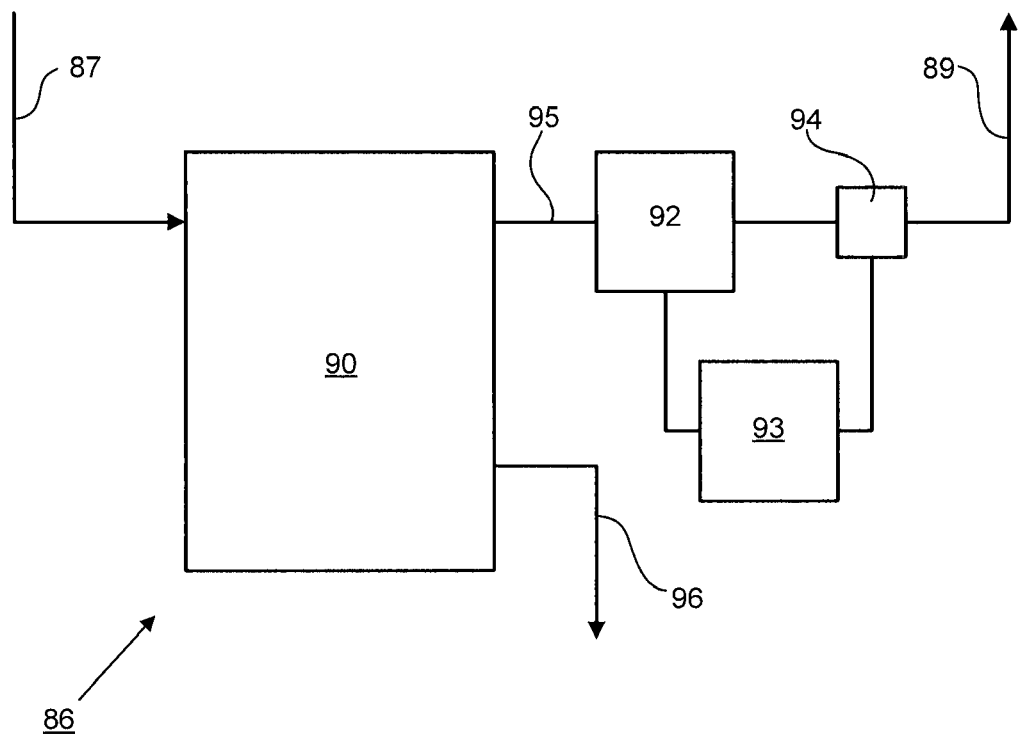
FIG. 15 depicts a reprocessing system to extract high thermal conductivity gas from fluid that has passed through the region between the substrate and substrate table.

FIG. 15 illustrates an example of a reprocessing system 86 to extract gas having a high thermal conductivity from fluid that has passed through the region 40 between the substrate W and the substrate table WT. The reprocessing system 86 receives fluid to be reprocessed via inlet 87 and outputs extracted gas via outlet 89 for reuse. In an embodiment, the reprocessing system 86 comprises a separation system to extract, from the input fluid, gas that has a lower density than the average density of gas in the fluid. In general, a gas having a thermal conductivity higher than or equal to 100 mW/(m·K) at 298 K will be significantly less dense than ambient gas or immersion fluid. The high thermal conductivity gas will therefore tend to rise to the top of a container containing the mixture of ambient gas, immersion liquid and high thermal conductivity gas. The separation system may therefore comprise a separation tank 90 having a waste outlet 96 in a lower portion of the separation tank 90 and a lower density gas outlet 95 in an upper portion of the separation tank 90. The purity of the gas which is extracted by the separation system, for example the gas which leaves the separation tank 90 via the lower density gas outlet 95, may be measured by means of a purity sensor 92. The purity sensor 92 may comprise a thermal conductivity sensor, a density sensor, or both, for example. In an embodiment, the output from the purity sensor 92 is input to a control system 93 which controls a rate of flow of the lower density gas out of the separation tank 90 on the basis of the output from the purity sensor 92. For example, the control system 93 may be configured to open a valve 94 to the outlet 89 when the purity sensor 92 indicates that the purity of the gas leaving the separation tank 90 is above a certain threshold (or when the thermal conductivity is above a certain threshold and/or when the density is below a certain threshold). When the purity sensor indicates that the gas is not yet of an acceptable quality, the control system 93 may close the valve 94 to stop or limit flow out of the separation tank 90. Stopping or limiting the flow in this way provides more time for the separation process within the separation tank 90 to progress. When the purity sensor 92 indicates that the gas is of the desired quality, or after a certain time has elapsed since the valve 94 has been closed, the control system 93 may open the valve 94 and resume the provision of reprocessed gas via the outlet 89.

In an embodiment, one or more of the substrate table assemblies described above may be used in the following method for unmounting a substrate from a substrate table. In a first phase, the gas handling system 30 is configured to provide the high thermal conductivity gas to the region 40 beneath the substrate W. The end of the first phase may correspond, for example, to the end of an exposure phase. In a second phase, the gas handling system switches to a mode in which a flushing gas (e.g., ambient gas and/or air) is provided to the region 40 beneath the substrate W instead of the high thermal conductivity gas. This process may be continued until the high thermal conductivity gas has been substantially flushed away from the region 40 beneath the substrate W. In a final phase, the substrate W is removed from the substrate table WT, desirably after the concentration of high thermal conductivity gas has fallen below a certain threshold value. In an embodiment, the process of providing flushing gas to the region 40 beneath the substrate W may be continued for a certain period of time sufficient to ensure that the concentration of high thermal conductivity gas will have fallen to below the threshold value. Alternatively or additionally, a sensor may be provided to detect the concentration of high thermal conductivity gas in the region 40 beneath the substrate W. For example, the concentration of high thermal conductivity gas may be estimated by measuring the thermal conductivity of the gas in the region 40. In an embodiment, the flow of ambient gas into the region 40 is continued until the measured thermal conductivity falls below a certain threshold level. These procedures reduce the risk of contamination of the region above the substrate W by release of high thermal conductivity gas when a substrate is unmounted.

As will be appreciated, where high thermal conductivity gas is supplied to the region between the substrate and the substrate table and the substrate is clamped to the substrate using a partial vacuum in this region, the high thermal conductivity gas will be supplied in such a way that the partial vacuum is maintained. For example, the flow rate of gas into the region, the flow rate of gas out of the region, or both, may be controlled to help ensure that the pressure in at least part of the region remains below one atmosphere, for example at about 0.5 atmosphere.

In an embodiment, the efficiency with which heat is transferred from the substrate table to the substrate can be increased by making use of the latent heat of vaporization/condensation of a liquid. In an embodiment, this is achieved by providing humid gas (e.g., humid air) into the region 40. When the substrate table is warmer than the substrate, there will be a net evaporation of liquid (e.g., water) from the surface of the substrate table and a net condensation of liquid onto the surface of the substrate. The evaporation process will extract heat efficiently from the substrate table due to the latent heat of vaporization. The condensation process will transfer heat efficiently to the substrate due to the latent heat of condensation. The latent heat of vaporization has the same magnitude as the latent heat of condensation.

The humid gas could be provided from an external source (i.e. where the evaporation process to generate the vapor is performed outside of the region 40). However, this approach may tend to lead to fluctuations in the temperature of the substrate when there are fluctuations in the pressure in the region 40 (the "clamp pressure").

Figure 19:
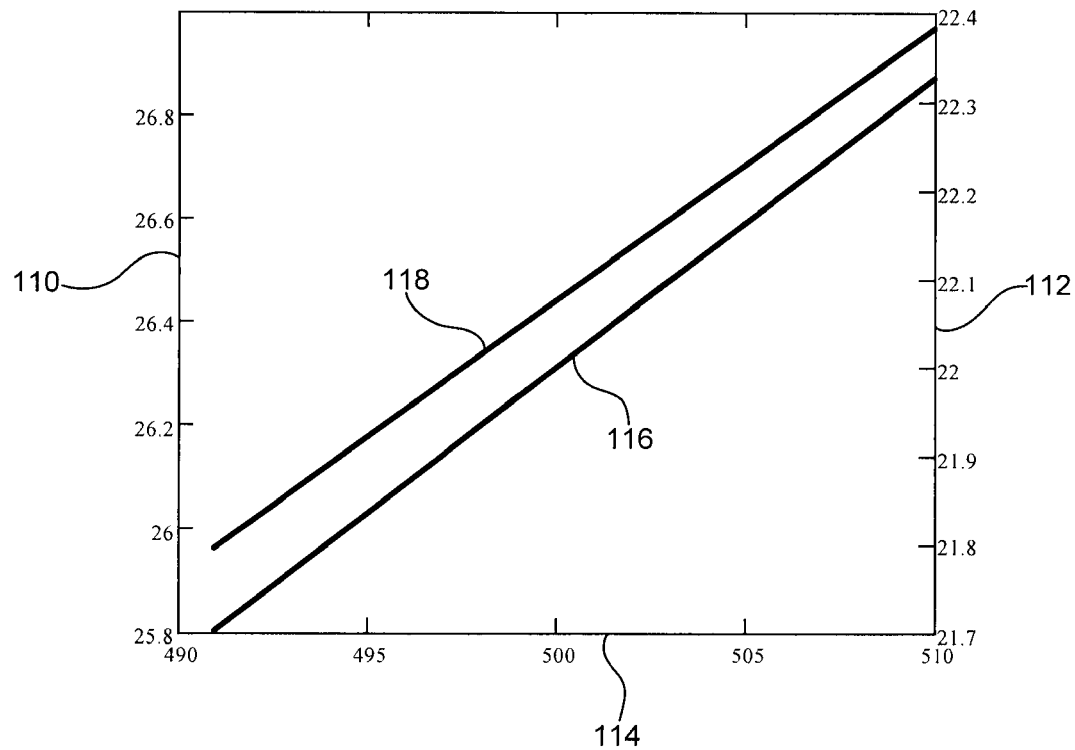
FIG. 19 depicts a graph showing how partial water pressure and saturation temperature would vary with clamp pressure in a system where humid air is provided to the region from an external system rather than via local evaporation.

FIG. 19 is a graph illustrating an example of how partial water pressure and saturation temperatures are expected to vary in the region 40 as a function of the clamp pressure. The vertical axis 110 represents partial water pressure in mbar. It is expected that a typical partial water pressure would be about 26.4 mbar. The vertical axis 112 represents saturation temperature in degrees C. The horizontal axis 114 represents the clamp pressure in mbar. The line 116 represents the variation of saturation temperature with clamp pressure. The line 118 represents the variation of partial water pressure with clamp pressure. As can be seen, an increase (or decrease) of merely 20 mbar in the clamp pressure, which is relatively small, is expected to lead to an increase (or decrease) of about 0.6 degrees C. in the saturation temperature, which is relatively large. The variation in saturation temperature will have a corresponding effect on the temperature of the substrate. The performance of a system using humid gas from an external source may therefore be hampered by variation in the clamp pressure.

In an embodiment, one or more problems discussed above, for example, in relation to the use of an external humid gas source are addressed by providing a covering of liquid over 20% or more of the portion of the substrate table WT that is opposite to the substrate W in use. The liquid vapor (e.g. water vapor) is then provided to the region 40 via local evaporation. The partial liquid (e.g., water) pressure will depend only on the temperature of the substrate table WT, which can be accurately controlled. The saturation temperature should no longer vary significantly with the clamp pressure.

As mentioned above, the liquid may cover at least 20% of the portion of the surface of the substrate table WT opposite to the substrate W. Desirably at least 30% is covered, more desirably at least 40%, or more desirably at least 50%. No pre-wetting of the substrate is required, although this could optionally be provided.

Figure 16:
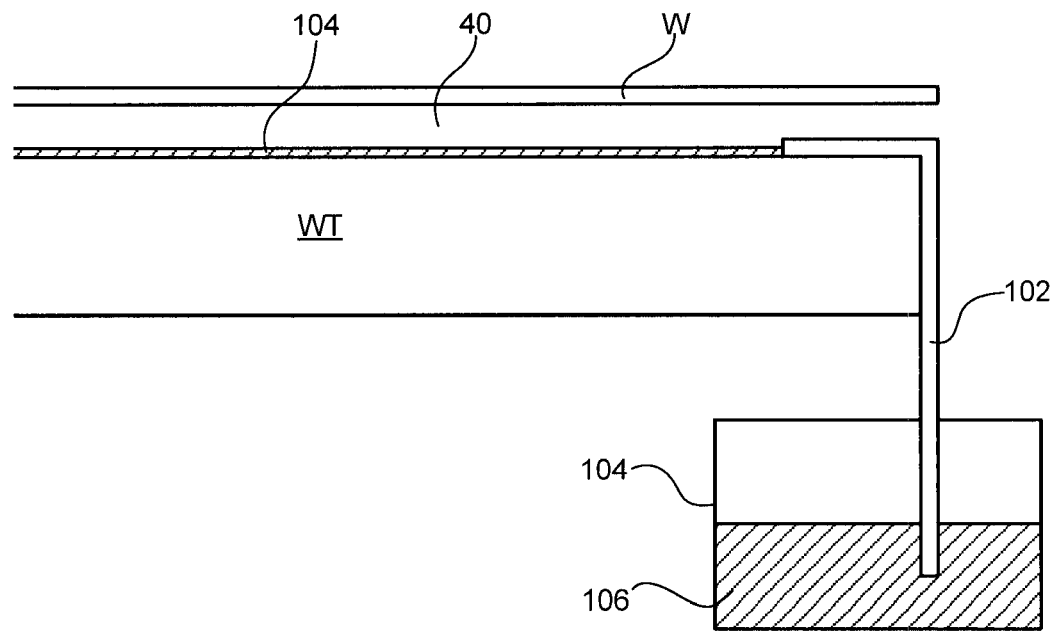
FIG. 16 depicts, in cross-section, a liquid handling system to provide liquid to a region between the substrate and the substrate table.

FIG. 16 shows an example of a liquid handling system to provide liquid to the region 40. In an embodiment the liquid handling system comprises a reservoir 104 containing liquid 106. A connector element 102 is provided to transport liquid from the reservoir 104 to the region 40. The connector element 102 may comprise a pipe and/or a wicking structure for example. The connector element 102 may be configured to pull liquid from the reservoir 104 to the region 40 using capillary action. Alternatively or additionally, the liquid 106 may be conveyed from the reservoir 104 to the region 40 using a different mechanism. For example, the pressure at the reservoir end of the connector element 102 may be arranged to be higher than the pressure at the region 40 so that the liquid is pushed towards the region 40 by the pressure difference.

In an embodiment the connector element 102 is connected to or part of a wicking structure that covers at least 20% of the portion of the surface of the substrate WT that is directly opposite the substrate W in use. The wicking structure may be configured to spread the liquid out in a thin layer over a region of the surface. The spreading out may be driven by capillary action for example. In an embodiment, the wicking structure may be lyophilic (e.g., hydrophilic). The wicking structure surface may have a contact angle with the liquid (e.g., water) of less than 30 degrees for example. In an embodiment, the wicking structure may comprise one or more groove structures that channel the liquid using capillary action. In an embodiment, the wicking structure comprises a porous structure. In an embodiment, the wicking structure is formed from porous SiC.

Figure 17:
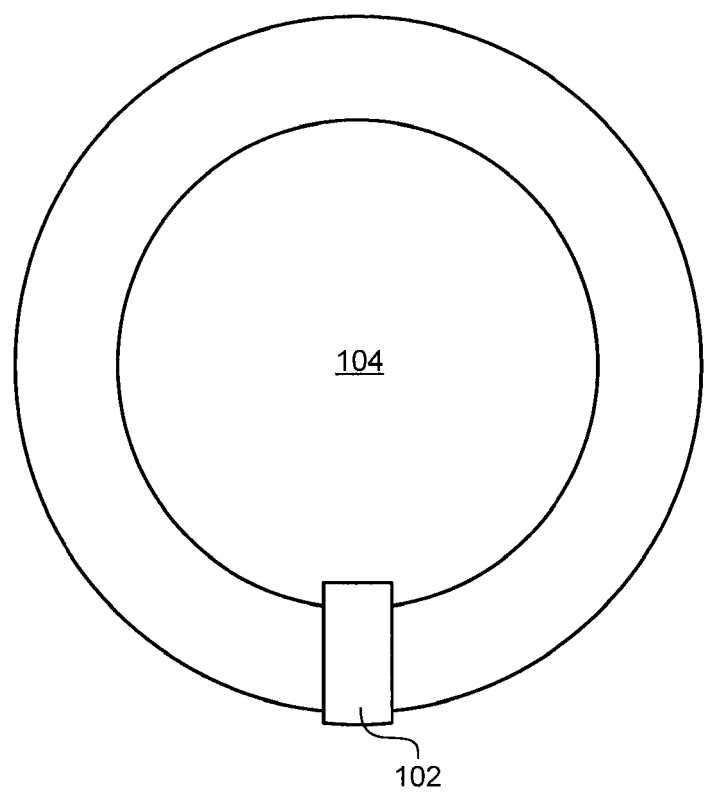
FIG. 17 depicts, in top view, an upper surface of the substrate table showing a wicking structure and a connector element of the liquid handling system of FIG. 16.

FIG. 17 is a top view illustrating schematically how a connector element 102 may lead to a wicking structure 104. In this embodiment, the wicking structure 105 has a circular form. However, the wicking structure 105 could have any other shape.

The rate at which liquid vapor travels from the relative hot substrate table to the relatively cold substrate may in principle be hampered by the need to diffuse through gas in the region 40. However, the separation between the substrate table and the substrate is so small that this effect is expected to be negligible.

The depth of the layer of liquid on the substrate table WT may be of the order of a few 100 nm minimum (corresponding to a volume of about 0.1 mL). In a typical application, the depth may be of the order of several microns. The minimum depth will be larger where the liquid layer cannot spread out uniformly over a surface, for example where the liquid layer is provided in the pores of a wick structure (e.g. a wick structure having a pore size of several microns).

When the substrate is unmounted the substrate may remain wet for a short period of time. However, the layer of liquid will be relatively thin and may evaporate quickly. The evaporation process could be accelerated by blowing dry gas (e.g., air) onto substrate. The evaporation of liquid at this stage will likely cause cooling of the substrate (by about 0.3 degrees C.). However, no lithography should be happening during this cooling so that no errors will result from this cooling.

Figure 18:
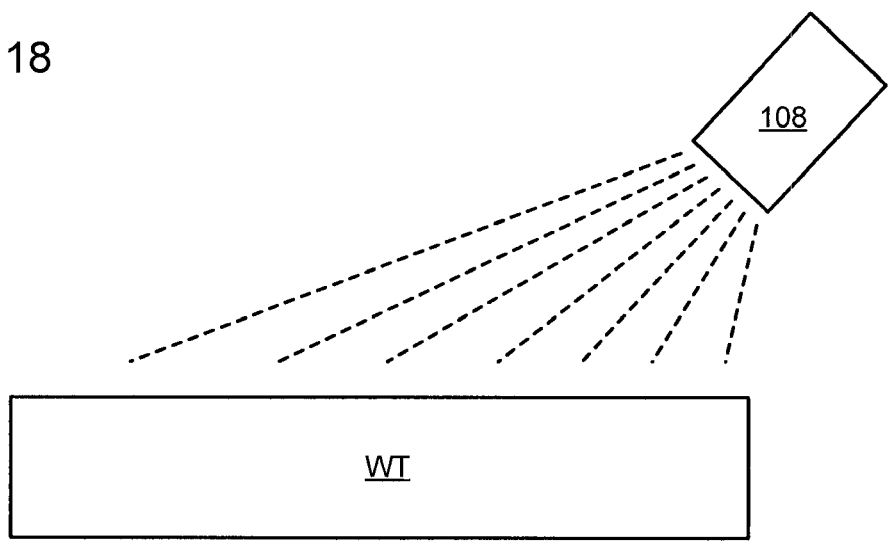
FIG. 18 is a schematic illustration showing application of liquid to the surface of the substrate table using an aerosol.

In an embodiment liquid is provided to the substrate table WT before the substrate W is mounted onto the substrate table WT. This could be done in a variety of ways. FIG. 18 illustrates use of an aerosol 108 to apply the liquid. In an embodiment, the aerosol 108 is configured to distribute the liquid finely, which assists with rapid formation of the thin liquid layer on the substrate table WT. Rapid formation of the thin liquid layer facilitates high throughput. The aerosol 108 may be configured to provide a spray of liquid (e.g., water) mist dispersed in gas (e.g., air). Alternatively or additionally, electrospraying may be used to apply the liquid. Electrospraying does not use gas to convey the liquid and may thus apply a lower heatload (less cooling) during spraying.

The provision of extraction ports 42 (see for example FIGS. 8, 10 and 12) and/or peripheral flow restricting structures 50A, 50B may not be sufficient to reduce to an acceptable level, or prevent, high thermal conductivity gas leaking to the region above the substrate. In the case of using He, for example, such a leak may reduce the accuracy of a measurement system such as an encoder. In the case of using $H_2$, there may be a safety concern due to the possible risk of explosion.

Figure 20:
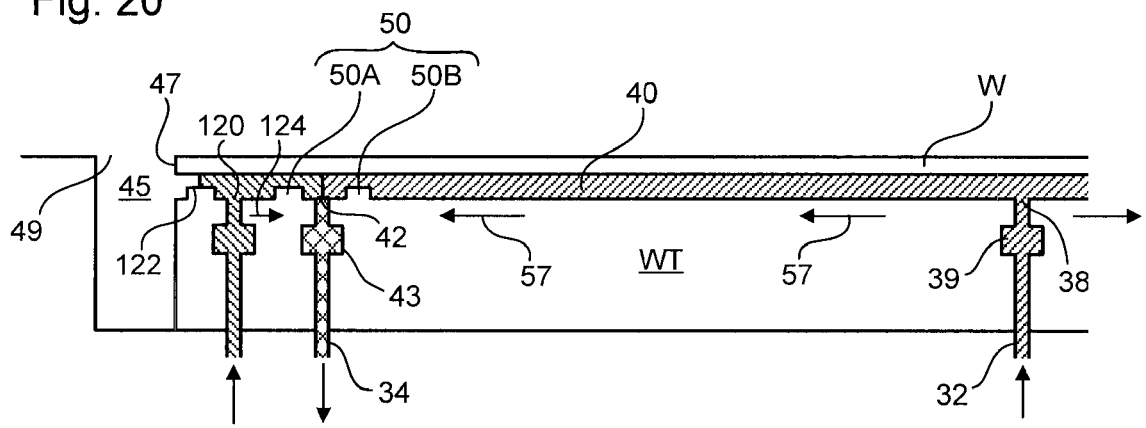
FIG. 20 depicts an embodiment of the type illustrated in FIG. 8 configured to use buffer gas to constrain high thermal conductivity gas.
Figure 21:
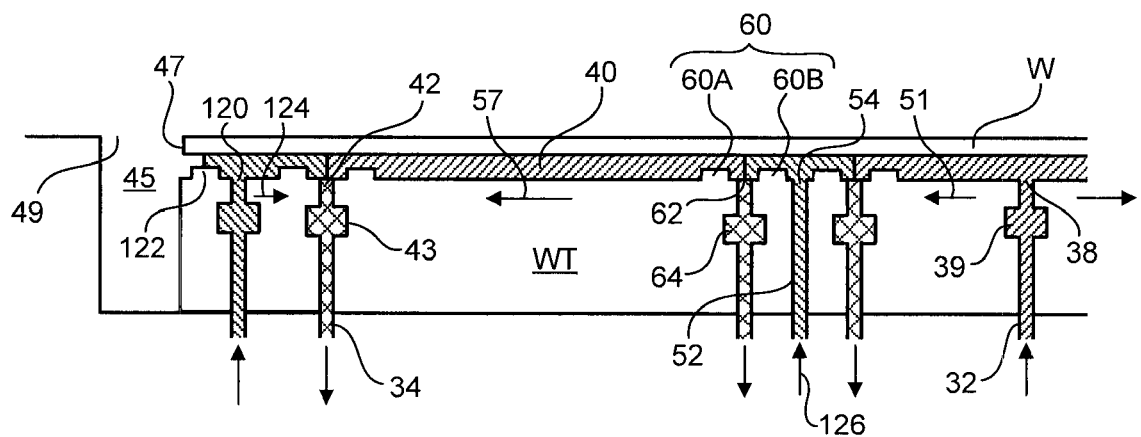
FIG. 21 depicts an embodiment of the type illustrated in FIG. 10 configured to supply buffer gas to the through-hole.
Figure 22:
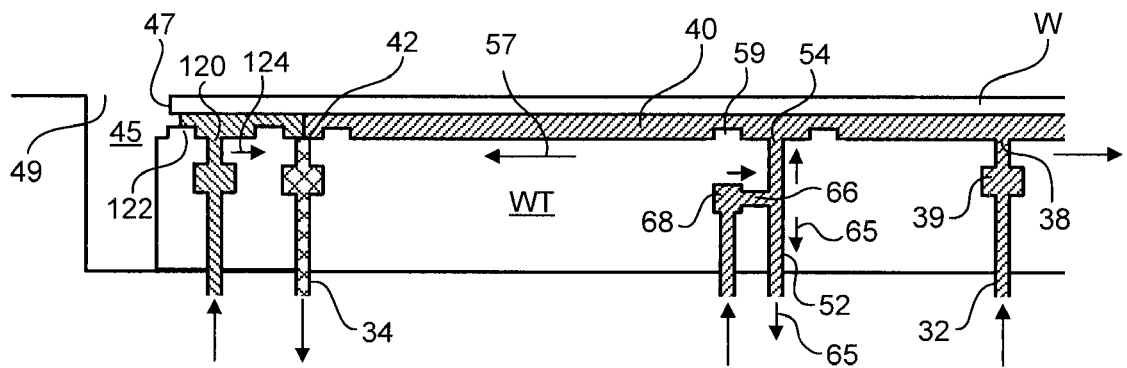
FIG. 22 depicts an embodiment of the type illustrated in FIG. 12 configured to use buffer gas to constrain high thermal conductivity gas.

In an embodiment, the risk, or extent, of the high thermal conductivity gas leakage is reduced by supplying a buffer gas to the region between the substrate table WT and the substrate W. In an embodiment, the high thermal conductivity gas (e.g. gas having a thermal conductivity greater than or equal to 100 mW/(m·K) at 298 K), which may be referred to as a "first gas", has a different composition to the buffer gas, which may be referred to as a "second gas". In an embodiment, the buffer gas acts as a barrier to the high thermal conductivity gas. In an embodiment, a buffer gas supply port provides a "curtain" of the buffer gas that peripherally (e.g., circumferentially) surrounds the high thermal conductivity gas. In an embodiment, the curtain forms a closed loop, optionally circular, optionally positioned near to the edge of the substrate. In an embodiment, the buffer gas is configured to flow in a radially inward direction in the region between the substrate table WT and the substrate W, optionally in an opposite direction to the flow of the high thermal conductivity gas. In an embodiment, the buffer gas comprises a gas having a higher thermal conductivity than ambient gas (e.g., ambient air). In an embodiment, the buffer gas comprises: >=99% $N_2$. In an embodiment, the buffer gas comprises >=99% $N_2$ and the high thermal conductivity gas comprises >=99% He. FIGS. 20, 21 and 22 depict example embodiments configured to use buffer gas.

FIG. 20 shows how an embodiment of the type described above with reference to FIG. 8 that could be configured to use buffer gas. In the embodiment shown, a buffer gas supply port 120 may be provided to supply buffer gas to the region underneath the substrate W. In the arrangement shown, a buffer gas flow restricting structure 122 may be provided to restrict leakage of the buffer gas to the outside environment. In an embodiment, the buffer gas flow restricting structure may be implemented as described above for the peripheral flow restricting structures 50A, 50B. In an embodiment, such as that shown in FIG. 20, where the peripheral flow restricting structures 50A, 50B are also provided, the buffer gas flow restricting structure may be provided radially outside of the peripheral flow restricting structures 50A, 50B, optionally peripherally surrounding the peripheral flow restricting structures 50A, 50B. In the embodiment shown, the buffer gas is configured to flow radially inwards (arrow 124). In an embodiment, the radially inward flow 124 is opposite in direction to the radially outward flow 57 of high thermal conductivity gas. In the embodiment shown, the radially inward flow 124 of the buffer gas is driven by the extraction port 42, which is configured to extract a mixture of the high thermal conductivity gas and the buffer gas. In an embodiment, the buffer gas flow restricting structure 122 is omitted. For example, the buffer gas flow restricting structure 122 may be omitted where the composition of the buffer gas is such that it would not interfere significantly with a process (e.g. a measurement process) happening in the region above the substrate.

In a variation of the embodiment shown in FIG. 20, the outermost peripheral flow restricting structure 50A is omitted. In a further variation of the embodiment shown in FIG. 20, both the outermost peripheral flow restricting structure 50A and the buffer gas flow restricting structure 122 are omitted. In a further variation, the inner peripheral flow restricting structure 50B is also omitted.

FIG. 21 shows how an embodiment of the type described above with reference to FIG. 10 could be configured to use buffer gas. As in the example shown in FIG. 20, a buffer gas supply port 120 and an optional buffer gas flow restricting structure 122 are provided. An inward flow 124 of the buffer gas is driven by suction from the extraction port 42. All of the variations discussed above with reference to FIG. 20 could also be applied to the embodiment of FIG. 21. Additionally or alternatively, a flow of the buffer gas 126 may be provided to the through-hole 52. The flow of buffer gas 126 through the through-hole 52 reduces the possibility of contact or mixing between the high thermal conductivity gas and ambient gas. Where the high thermal conductivity gas comprises $H_2$, the buffer gas may thereby reduce the risk of explosion in the region of the through-hole 52.

FIG. 22 shows how an embodiment of the type described above with reference to FIG. 12 that could be configured to use buffer gas. As in the examples shown in FIGS. 20 and 21, a buffer gas supply port 120 and an optional buffer gas flow restricting structure 122 are provided. An inward flow 124 of the buffer gas is driven by suction from the extraction port 42. All of the variations discussed above with reference to FIG. 20 could also be applied to the embodiment of FIG. 22.

In an embodiment, there is provided a substrate table assembly for an immersion lithography apparatus, the substrate table assembly comprising: a substrate table to support a substrate; and a gas handling system to provide a gas to a region between the substrate table and a substrate mounted on the substrate table, wherein the gas provided by the gas handling system has a thermal conductivity greater than or equal to 100 mW/(m·K) at 298 K, wherein the gas provided by the gas handling system comprises $H_2$.

In an embodiment, there is provided a substrate table assembly for an immersion lithography apparatus, the substrate table assembly comprising: a substrate table to support a substrate; and a gas handling system to provide a gas to a region between the substrate table and a substrate mounted on the substrate table, wherein the gas provided by the gas handling system has a thermal conductivity greater than or equal to 100 mW/(m·K) at 298 K, wherein the substrate table comprises a supply port to supply the gas from the gas handling system to the region between the substrate and the substrate table, and an extraction port to extract fluid from the region, the extraction port comprising a peripheral extraction port configured to provide a laterally inward flow of ambient gas, immersion fluid, or both, from a region adjacent to the periphery of the substrate.

In an embodiment, the supply and extraction ports are configured to provide a laterally outward flow of the gas provided by the gas handling system in a region directly adjacent to the peripheral extraction port. In an embodiment, the substrate table assembly further comprises a peripheral flow restricting structure in the form of a closed path to restrict flow of fluid between a laterally inner and a laterally outer portion of the region between the substrate and the substrate table, relative to a center of the substrate and/or substrate table. In an embodiment, the peripheral flow restricting structure comprises an inner peripheral flow restricting structure and an outer peripheral flow restricting structure, the inner peripheral flow restricting structure being surrounded by the outer peripheral flow restricting structure. In an embodiment, the peripheral extraction port is located between the inner and outer peripheral flow restricting structures. In an embodiment, the substrate table assembly further comprises an intermediate peripheral flow restricting structure between the inner and outer peripheral flow restricting structures. In an embodiment, the peripheral extraction port is located within at least two of the regions between adjacent peripheral flow restricting structures.

In an embodiment, there is provided a substrate table assembly for an immersion lithography apparatus, the substrate table assembly comprising: a substrate table to support a substrate; and gas handling system to provide a first gas to a region between the substrate table and a substrate mounted on the substrate table, wherein the first gas provided by the gas handling system has a thermal conductivity greater than or equal to 100 mW/(m·K) at 298 K, wherein the gas handling system is further configured to provide a buffer gas as a second gas to the region between the substrate table and a substrate mounted on the substrate table, the buffer gas having a different composition to the first gas.

In an embodiment, the first gas/gas having a thermal conductivity greater than or equal to 100 mW/(m·K) at 298 K comprises >=99% He. In an embodiment, the substrate table assembly further comprises a buffer gas supply port configured to supply buffer gas to the region between the substrate table and a substrate mounted on the substrate table. In an embodiment, the buffer gas supply port is configured to provide a radially inward flow of buffer gas. In an embodiment, the buffer gas supply port is configured to provide a curtain of buffer gas that peripherally surrounds the first gas/gas having a thermal conductivity greater than or equal to 100 mW/(m·K) at 298 K. In an embodiment, the substrate table assembly further comprises a buffer gas flow restricting structure to restrict radially outward flow of the buffer gas. In an embodiment, the substrate table assembly is configured to supply a buffer gas to the buffer gas supply port having a different composition to the first gas/gas having a thermal conductivity greater than or equal to 100 mW/(m·K) at 298 K. In an embodiment, the buffer gas has a higher thermal conductivity than air. In an embodiment, the buffer gas comprises >=99% $N_2$.

In an embodiment, there is provided a substrate table assembly for an immersion lithography apparatus, the substrate table assembly comprising: a substrate table to support a substrate; and a gas handling system to provide a gas to a region between the substrate table and a substrate mounted on the substrate table, wherein the gas provided by the gas handling system has a thermal conductivity greater than or equal to 100 mW/(m·K) at 298 K, wherein the substrate table comprises a through-hole having an opening into the region between the substrate and the substrate table.

In an embodiment, the substrate table assembly further comprises a through-hole flow restricting structure surrounding the opening of the through-hole. In an embodiment, the substrate table assembly further comprises a through-hole extraction port to extract fluid from the region adjacent to the opening of the through-hole. In an embodiment, the through-hole flow restricting structure comprises an inner through-hole flow restricting structure and an outer through-hole flow restricting structure, both surrounding the opening of the through-hole, the through-hole extraction port being located between the inner and outer through-hole flow restricting structures. In an embodiment, the substrate table assembly further comprises an intermediate through-hole flow restricting structure between the inner and outer through-hole flow restricting structures. In an embodiment, the through-hole extraction port is located within at least two of the regions between adjacent though-hole flow restricting structures. In an embodiment, the substrate table assembly is further configured to supply a flow of buffer gas towards the substrate through the through-hole. In an embodiment, the substrate table comprises a through-hole supply port to supply the gas having a thermal conductivity greater than or equal to 100 mW/(m·K) at 298 K to the through-hole such that in at least a portion of the through-hole a gas flow away from the substrate is established. In an embodiment, the through-hole supply port opens out laterally into the through-hole. In an embodiment, the through-hole is configured to provide access to a pin for use during mounting or unmounting of the substrate from the substrate table or to a pin for alignment of the substrate table relative to a mounting block for the substrate table.

In an embodiment, there is provided a substrate table assembly for an immersion lithography apparatus, the substrate table assembly comprising: a substrate table to support a substrate; a gas handling system to provide a gas to a region between the substrate table and a substrate mounted on the substrate table, wherein the gas provided by the gas handling system has a thermal conductivity greater than or equal to 100 mW/(m·K) at 298 K; and an edge seal to provide a seal at an outer peripheral edge of the substrate between the region above the substrate and the region in between the substrate and the substrate table, wherein the assembly is configured to provide a laterally inward flow of the gas having a thermal conductivity greater than or equal to 100 mW/(m·K) at 298 K from a region adjacent to the periphery of the substrate.

In an embodiment, there is provided a substrate table assembly for an immersion lithography apparatus, the substrate table assembly comprising: a substrate table to support a substrate; and a gas handling system to provide a gas to a region between the substrate table and a substrate mounted on the substrate table, wherein the gas provided by the gas handling system has a thermal conductivity greater than or equal to 100 mW/(m·K) at 298 K and the gas handling system comprises a flushing reservoir to store gas having a thermal conductivity greater than or equal to 100 mW/(m·K) at 298 K at a pressure greater than atmospheric pressure.

In an embodiment, the substrate table assembly further comprises a connection system to connect the flushing reservoir to the region between the substrate mounted on the substrate table and the substrate table in order to provide a flushing flow of a certain amount of the gas having a thermal conductivity greater than or equal to 100 mW/(m·K) at 298 K into the region. In an embodiment, the gas handling system comprises a continuous flow system to provide a continuous flow of the gas having a thermal conductivity greater than or equal to 100 mW/(m·K) at 298 K at a substantially constant pressure, the pressure being lower than atmospheric pressure. In an embodiment, the connection system is configured to allow switching between the flushing flow and the continuous flow.

In an embodiment, there is provided a substrate table assembly for an immersion lithography apparatus, the substrate table assembly comprising: a substrate table to support a substrate; and a gas handling system to provide a gas to a region between the substrate table and a substrate mounted on the substrate table, wherein the gas provided by the gas handling system has a thermal conductivity greater than or equal to 100 mW/(m·K) at 298 K and the gas handling system comprises a reprocessing system to extract gas having a thermal conductivity greater than or equal to 100 mW/(m·K) at 298 K from fluid that has passed through the region between the substrate and the substrate table.

In an embodiment, the reprocessing system comprises a separation system to extract from the fluid gas that has a lower density than the average density of gas in the fluid. In an embodiment, the separation system comprises a separation tank comprising a waste outlet in a lower portion of the separation tank and a lower density gas outlet in an upper portion of the separation tank. In an embodiment, the substrate table assembly further comprises a purity sensor to measure the purity of the lower density gas output from the separation system. In an embodiment, the substrate table assembly further comprises a control system configured to control a rate of flow of the lower density gas out of the separation system on the basis of an output from the purity sensor. In an embodiment, the purity sensor comprises a thermal conductivity sensor, or a density sensor, or both.

In an embodiment, there is provided a substrate table assembly for an immersion lithography apparatus, the substrate table assembly comprising: a substrate table to support a substrate; a gas handling system to provide a gas to a region between the substrate table and a substrate mounted on the substrate table, wherein the gas provided by the gas handling system has a thermal conductivity greater than or equal to 100 mW/(m·K) at 298 K; and a suction reservoir configured to be held at a partial vacuum and selectively connectable to the region between the substrate and the substrate table to remove fluid therefrom.

In an embodiment, there is provided a substrate table assembly for an immersion lithography apparatus, the substrate table assembly comprising: a substrate table to support a substrate; and a liquid handling system to provide a liquid to a region between the substrate table and the substrate mounted on the substrate table so as to cover with liquid in use at least 20% of the surface area of the portion of the substrate table that is directly opposite the substrate.

In an embodiment, the liquid comprises water. In an embodiment, the liquid handling system comprises a connector element to connect the surface of the substrate table to a liquid reservoir. In an embodiment, the connector element is configured to pull liquid to the surface of the substrate table from the liquid reservoir by capillary action. In an embodiment, the substrate table comprises a wicking structure configured to spread liquid out over a region of the surface by capillary action. In an embodiment, the wicking structure comprises one or more selected from the following: porous SiC, a groove structure, and/or a lyophilic composition. In an embodiment, the substrate table assembly further comprises a gas handling system to provide a gas to a region between the substrate table and a substrate mounted on the substrate table, wherein the gas provided by the gas handling system has a thermal conductivity greater than or equal to 100 mW/(m·K) at 298 K.

In an embodiment, there is provided a substrate table assembly for an immersion lithography apparatus, the substrate table assembly comprising: a substrate table to support a substrate; and a gas handling system to provide a gas to a region between the substrate table and a substrate mounted on the substrate table, wherein the substrate table comprises a through-hole having an opening into the region between the substrate and the substrate table, and the assembly further comprises a through-hole flow restricting structure surrounding the opening of the through-hole, the through-hole flow restricting structure forming a closed path around the opening.

In an embodiment, there is provided an immersion lithography apparatus, comprising the substrate table assembly as described herein.

In an embodiment, there is provided a method of unmounting a substrate from a substrate table in a substrate table assembly as described herein, the method comprising the following steps in order: using the gas handling system to provide gas having a thermal conductivity greater than or equal to 100 mW/(m·K) at 298 K to the region between the substrate and the substrate table; using the gas handling system to provide a flushing gas to the region between the substrate and the substrate table to flush away the gas having a thermal conductivity greater than or equal to 100 mW/(m·K) at 298 K; and removing the substrate from the substrate table when the concentration of the gas having a thermal conductivity greater than or equal to 100 mW/(m·K) at 298 K falls below a certain threshold value.

In an embodiment, there is provided a method of mounting a substrate onto a substrate table in a substrate table assembly as described herein, the method comprising the following steps in order: placing the substrate on the substrate table; establishing a pressure in a central portion of the region between the substrate and the substrate table that is lower than atmospheric pressure; introducing the gas having a thermal conductivity greater than or equal to 100 mW/(m·K) at 298 K in the region between the substrate and the substrate table; and establishing a constant flow of gas through the region between the substrate and the substrate table at a substantially constant pressure below atmospheric pressure.

In an embodiment, introducing the gas having a thermal conductivity greater than or equal to 100 mW/(m·K) at 298 K is performed by connecting the region between the substrate and the substrate table to a flushing reservoir comprising a certain quantity of the gas having a thermal conductivity greater than or equal to 100 mW/(m·K) at 298 K at a pressure above atmospheric pressure. In an embodiment, the pressure lower than atmospheric pressure in the central portion is also lower than a pressure near a peripheral edge of the substrate in the region between the substrate and the substrate table and the method further comprises a later step of reducing the pressure at the peripheral edge to a level substantially equal to the pressure in the central portion.

In an embodiment, there is provided a method of mounting a substrate onto a substrate table in a substrate table assembly as described herein, the method comprising the following steps in order: applying a liquid to a surface of the substrate table; and placing a substrate on the substrate table, wherein the liquid covers at least 20% of the surface area of the portion of the substrate table that is directly opposite the substrate.

In an embodiment, the liquid is applied using an aerosol or electrospraying.

In an embodiment, there is provided a device manufacturing method, comprising: projecting a patterned beam of radiation through an immersion liquid confined to a space between a projection system and a substrate; and providing gas to a region between the substrate and a substrate table, wherein the gas has a thermal conductivity greater than or equal to 100 mW/(m·K) at 298 K, wherein the gas comprises $H_2$.

In an embodiment, there is provided a device manufacturing method, comprising: projecting a patterned beam of radiation through an immersion liquid confined to a space between a projection system and a substrate; providing gas to a region between the substrate and a substrate table, wherein the gas has a thermal conductivity greater than or equal to 100 mW/(m·K) at 298 K; and providing a laterally inward flow of ambient gas, immersion fluid, or both, from a region adjacent to the periphery of the substrate.

In an embodiment, there is provided a device manufacturing method, comprising: projecting a patterned beam of radiation through an immersion liquid confined to a space between a projection system and a substrate; providing a first gas to a region between the substrate and a substrate table, wherein the first gas has a thermal conductivity greater than or equal to 100 mW/(m·K) at 298 K; and providing a buffer gas as a second gas to the region between the substrate and the substrate table, the buffer gas having a different composition to the first gas.

In an embodiment, there is provided a device manufacturing method, comprising: projecting a patterned beam of radiation through an immersion liquid confined to a space between a projection system and a substrate; and providing gas to a region between the substrate and a substrate table, wherein the gas has a thermal conductivity greater than or equal to 100 mW/(m·K) at 298 K, wherein the substrate table comprises a through-hole having an opening into the region between the substrate and the substrate table.

In an embodiment, there is provided a device manufacturing method, comprising: projecting a patterned beam of radiation through an immersion liquid confined to a space between a projection system and a substrate; providing gas to a region between the substrate and a substrate table, wherein the gas has a thermal conductivity greater than or equal to 100 mW/(m·K) at 298 K; sealing at an outer peripheral edge of the substrate between the region above the substrate and the region in between the substrate and the substrate table; and providing a laterally inward flow of the gas having a thermal conductivity greater than or equal to 100 mW/(m·K) at 298 K from a region adjacent to the periphery of the substrate.

In an embodiment, there is provided a device manufacturing method, comprising: projecting a patterned beam of radiation through an immersion liquid confined to a space between a projection system and a substrate; providing gas to a region between the substrate and a substrate table, wherein the gas has a thermal conductivity greater than or equal to 100 mW/(m·K) at 298 K; and extracting gas having a thermal conductivity greater than or equal to 100 mW/(m·K) at 298 K from fluid that has passed through the region between the substrate and the substrate table in order to reuse the extracted gas.

In an embodiment, there is provided a device manufacturing method, comprising: projecting a patterned beam of radiation through an immersion liquid confined to a space between a projection system and a substrate; and providing liquid to a region between the substrate and a substrate table supporting the substrate so as to cover at least 20% of the surface area of the portion of the substrate table that is directly opposite the substrate.

In an embodiment, there is provided a device manufacturing method, comprising: projecting a patterned beam of radiation through an immersion liquid confined to a space between a projection system and a substrate; and providing gas to a region between the substrate and a substrate table, wherein the substrate table comprises a through-hole having an opening into the region between the substrate and the substrate table, and wherein a through-hole flow restricting structure surrounds the opening of the through-hole, the through-hole flow restricting structure forming a closed path around the opening.

As will be appreciated, any of the above described features can be used with any other feature and it is not only those combinations explicitly described which are covered in this application. For example, an embodiment of the invention could be applied to the embodiments of FIGS. 2 to 6.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains one or multiple processed layers.

The terms "radiation" and "beam" used herein encompass all types of electromagnetic radiation, including ultraviolet (UV) radiation (e.g. having a wavelength of or about 365, 248, 193, 157 or 126 nm). The term "lens", where the context allows, may refer to any one or combination of various types of optical components, including refractive and reflective optical components.

While specific embodiments of the invention have been described above, it will be appreciated that the invention may be practiced otherwise than as described. For example, the embodiments of the invention may take the form of a computer program containing one or more sequences of machine-readable instructions describing a method as disclosed above, or a data storage medium (e.g. semiconductor memory, magnetic or optical disk) having such a computer program stored therein. Further, the machine readable instruction may be embodied in two or more computer programs. The two or more computer programs may be stored on one or more different memories and/or data storage media.

Any controllers described herein may each or in combination be operable when the one or more computer programs are read by one or more computer processors located within at least one component of the lithographic apparatus. The controllers may each or in combination have any suitable configuration for receiving, processing, and sending signals. One or more processors are configured to communicate with the at least one of the controllers. For example, each controller may include one or more processors for executing the computer programs that include machine-readable instructions for the methods described above. The controllers may include data storage medium for storing such computer programs, and/or hardware to receive such medium. So the controller(s) may operate according the machine readable instructions of one or more computer programs.

One or more embodiments of the invention may be applied to any immersion lithography apparatus, in particular, but not exclusively, those types mentioned above and whether the immersion liquid is provided in the form of a bath, only on a localized surface area of the substrate, or is unconfined. In an unconfined arrangement, the immersion liquid may flow over the surface of the substrate and/or substrate table so that substantially the entire uncovered surface of the substrate table and/or substrate is wetted. In such an unconfined immersion system, the liquid supply system may not confine the immersion liquid or it may provide a proportion of immersion liquid confinement, but not substantially complete confinement of the immersion liquid.

A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more fluid openings including one or more liquid openings, one or more gas openings or one or more openings for two phase flow. The openings may each be an inlet into the immersion space (or an outlet from a fluid handling structure) or an outlet out of the immersion space (or an inlet into the fluid handling structure). In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

The descriptions above are intended to be illustrative, not limiting. Thus, it will be apparent to one skilled in the art that modifications may be made to the invention as described without departing from the scope of the claims set out below.

The invention claimed is:

1. A substrate table assembly for an immersion lithography apparatus, the substrate table assembly comprising:
a substrate table to support a substrate; and
a gas handling system to provide a gas to a region between the substrate table and a substrate mounted on the substrate table, wherein the gas provided by the gas handling system has a thermal conductivity greater than or equal to 100 mW/(m·K) at 298 K,
wherein the substrate table comprises a supply port to supply the gas from the gas handling system to the region between the substrate and the substrate table, and an extraction port to extract fluid from the region, the extraction port comprising a peripheral extraction port configured to provide a laterally inward flow of ambient gas, immersion fluid, or both, from a region adjacent to the periphery of the substrate and configured to extract at least some of the gas at a same time as providing the inward flow, wherein the substrate table is configured to provide an open flowpath underneath the substrate when provided on the substrate table, that connects the supply port and the peripheral extraction port and configured to allow the gas from the supply port to cover a majority of the bottom surface of the substrate when provided on the substrate table.

2. The substrate table assembly according to claim 1, wherein the supply and extraction ports are configured to provide a laterally outward flow of the gas provided by the gas handling system in a region directly adjacent to the peripheral extraction port.

3. The substrate table assembly according to claim 2, further comprising a peripheral flow restricting structure in the form of a closed path to restrict flow of fluid between a laterally inner and a laterally outer portion of the region between the substrate and the substrate table, relative to a center of the substrate and/or substrate table.

4. The substrate table assembly according to claim 3, wherein the peripheral flow restricting structure comprises an inner peripheral flow restricting structure and an outer peripheral flow restricting structure, the inner peripheral flow restricting structure being surrounded by the outer peripheral flow restricting structure.

5. The substrate table assembly according to claim 4, wherein the peripheral extraction port is located between the inner and outer peripheral flow restricting structures.

6. The substrate table assembly according to claim 5, further comprising an intermediate peripheral flow restricting structure between the inner and outer peripheral flow restricting structures.

7. The substrate table assembly according to claim 6, wherein the peripheral extraction port is located within at least two of the regions between adjacent peripheral flow restricting structures.

8. The substrate table assembly according to claim 1, further comprising a buffer gas supply port configured to supply buffer gas to the region between the substrate table and a substrate mounted on the substrate table.

9. The substrate table assembly according to claim 1, wherein the gas handling system comprises a continuous flow system to provide a continuous flow of the gas having a thermal conductivity greater than or equal to 100 mW/(m·K) at 298 K at a substantially constant pressure, the pressure being lower than atmospheric pressure.

10. A substrate table assembly for an immersion lithography apparatus, the substrate table assembly comprising:
a substrate table to support a substrate; and
a gas handling system to provide a gas to a region between the substrate table and a substrate mounted on the substrate table, wherein the gas provided by the gas handling system has a thermal conductivity greater than or equal to 100 mW/(m·K) at 298 K,
wherein the substrate table comprises a supply port to supply the gas from the gas handling system to the region between the substrate and the substrate table, and an extraction port to extract fluid from the region, the extraction port comprising a peripheral extraction port configured to provide a laterally inward flow of ambient gas, immersion fluid, or both, from a region adjacent to the periphery of the substrate and configured to extract at least some of the gas at a same time as providing the inward flow, wherein the substrate table is configured to provide an open flowpath underneath the substrate when provided on the substrate table, that connects the supply port and the peripheral extraction port and configured to allow the gas from the supply port to cover a majority of the bottom surface of the substrate when provided on the substrate table, and
wherein the substrate table comprises a through-hole having an opening into the region between the substrate and the substrate table.

11. The substrate table assembly according to claim 10, further comprising a through-hole flow restricting structure surrounding the opening of the through-hole.

12. The substrate table assembly according to claim 10, further comprising a through-hole extraction port to extract fluid from the region adjacent to the opening of the through-hole.

13. The substrate table assembly according to claim 12, wherein the through-hole flow restricting structure comprises an inner through-hole flow restricting structure and an outer through-hole flow restricting structure, both surrounding the opening of the through-hole, the through-hole extraction port being located between the inner and outer through-hole flow restricting structures.

14. The substrate table assembly according to claim 13, further comprising an intermediate through-hole flow restricting structure between the inner and outer through-hole flow restricting structures.

15. The substrate table assembly according to claim 14, wherein the through-hole extraction port is located within at least two of the regions between adjacent though-hole flow restricting structures.

16. The substrate table assembly according to claim 10, further configured to supply a flow of buffer gas towards the substrate through the through-hole.

17. The substrate table assembly according to claim 10, wherein the substrate table comprises a through-hole supply port to supply the gas having a thermal conductivity greater than or equal to 100 mW/(m·K) at 298 K to the through-hole such that in at least a portion of the through-hole a gas flow away from the substrate is established.

18. The substrate table assembly according to claim 10, wherein the through-hole is configured to provide access to a pin for use during mounting or unmounting of the substrate from the substrate table or to a pin for alignment of the substrate table relative to a mounting block for the substrate table.

19. A device manufacturing method, comprising:
projecting a patterned beam of radiation through an immersion liquid confined to a space between a projection system and a substrate;
providing gas to a region between the substrate and a substrate table using a supply port, wherein the gas has a thermal conductivity greater than or equal to 100 mW/(m·K) at 298 K;
providing a laterally inward flow of ambient gas, immersion liquid, or both, from a region adjacent to the periphery of the substrate using a peripheral extraction port; and
extracting at least some of the gas using the peripheral extraction port at a same time as providing the inward flow, wherein there is an open flowpath underneath the substrate that connects the supply port and the peripheral extraction port and wherein the gas from the supply port covers a majority of the bottom surface of the substrate.

20. A device manufacturing method, comprising:
projecting a patterned beam of radiation through an immersion liquid confined to a space between a projection system and a substrate;
providing gas to a region between the substrate and a substrate table using a supply port, wherein the gas has a thermal conductivity greater than or equal to 100 mW/(m·K) at 298 K;
providing a laterally inward flow of ambient gas, immersion liquid, or both, from a region adjacent to the periphery of the substrate using a peripheral extraction port; and
extracting at least some of the gas using the peripheral extraction port at a same time as providing the inward flow, wherein there is an open flowpath underneath the substrate that connects the supply port and the peripheral extraction port and wherein the gas from the supply port covers a majority of the bottom surface of the substrate,
wherein the substrate table comprises a through-hole having an opening into the region between the substrate and the substrate table.

* * * * *